(12) United States Patent
Yoshida et al.

(10) Patent No.: US 7,187,213 B2
(45) Date of Patent: Mar. 6, 2007

(54) SEMICONDUCTOR CIRCUIT

(75) Inventors: Hiroshi Yoshida, Fukuoka (JP); Kazuhito Fujii, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 133 days.

(21) Appl. No.: 11/006,692

(22) Filed: Dec. 8, 2004

(65) Prior Publication Data
US 2005/0122152 A1 Jun. 9, 2005

(30) Foreign Application Priority Data
Dec. 9, 2003 (JP) ............... 2003-410777
Jul. 9, 2004 (JP) ............... 2004-203247

(51) Int. Cl.
H03K 9/08 (2006.01)
H03B 1/00 (2006.01)

(52) U.S. Cl. ............... 327/34; 327/552; 327/558

(58) Field of Classification Search ............... None
See application file for complete search history.

(56) References Cited

U.S. PATENT DOCUMENTS 4,912,420 A * 3/1990 Parnell ............... 327/78
5,120,988 A * 6/1992 Matsuki ............... 327/144
5,742,183 A * 4/1998 Kuroda ............... 326/81
5,834,968 A * 11/1998 Imamiya ............... 327/552
5,973,982 A * 10/1999 Suyama et al. ........ 365/230.01
6,507,221 B2 * 1/2003 La Rosa ............... 327/34
6,940,326 B2 * 9/2005 Chen et al. ............... 327/166

FOREIGN PATENT DOCUMENTS

JP 07-095022 4/1995

* cited by examiner

Primary Examiner—Tuan T. Lam
(74) Attorney, Agent, or Firm—McDermott Will & Emery LLP

(57) ABSTRACT

The present invention provides a semiconductor circuit capable of effectively applying a filter function to both of L-level noise superimposed during originally H signal periods and H-level noise superimposed during originally L signal periods. An input signal branches off into two and one of them is inputted through signal inverting means to a first delay circuit including a first capacitor. The other is inputted to a second delay circuit including a second capacitor. An output signal from the first delay circuit and an output signal from the second delay circuit are inputted to separate input terminals of a flip-flop.

3 Claims, 20 Drawing Sheets

F I G . 1
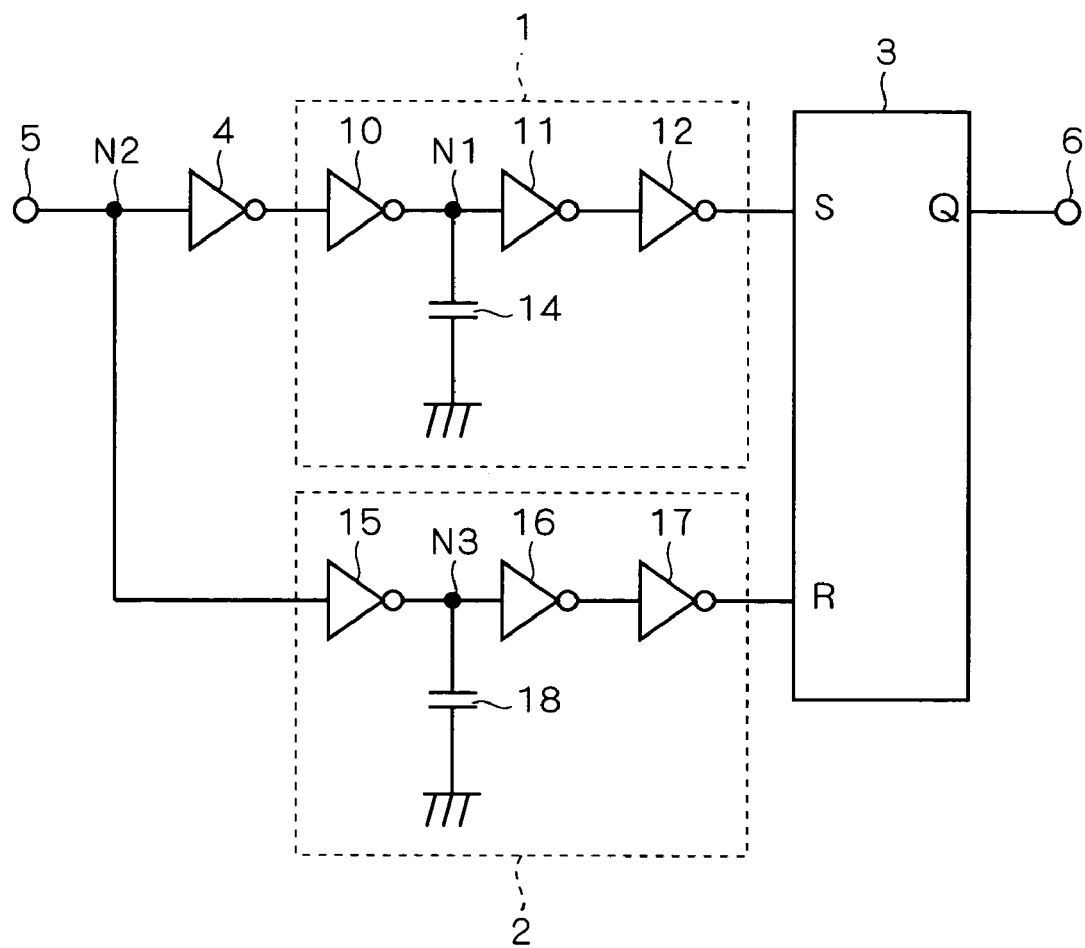

| INPUTS | | OUTPUT |
| --- | --- | --- |
| S INPUT TERMINAL | R INPUT TERMINAL | Q OUTPUT TERMINAL |
| H | L | H |
| L | H | L |
| L | L | HOLD |

F I G . 7
| INPUTS | | OUTPUT |
|---|---|---|
| S' INPUT TERMINAL | R' INPUT TERMINAL | Q OUTPUT TERMINAL |
| L | H | H |
| H | L | L |
| H | H | HOLD |
F I G . 8
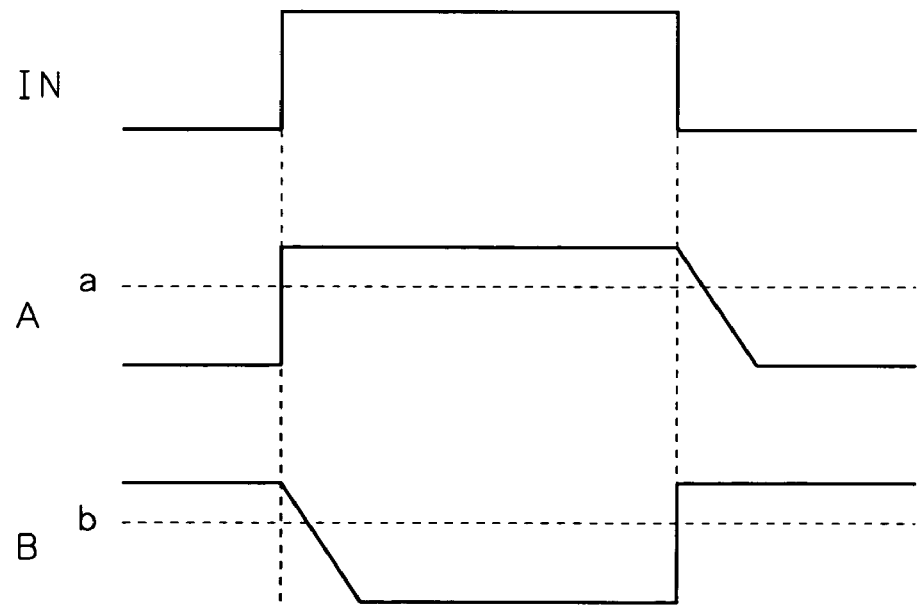

F I G . 2 1
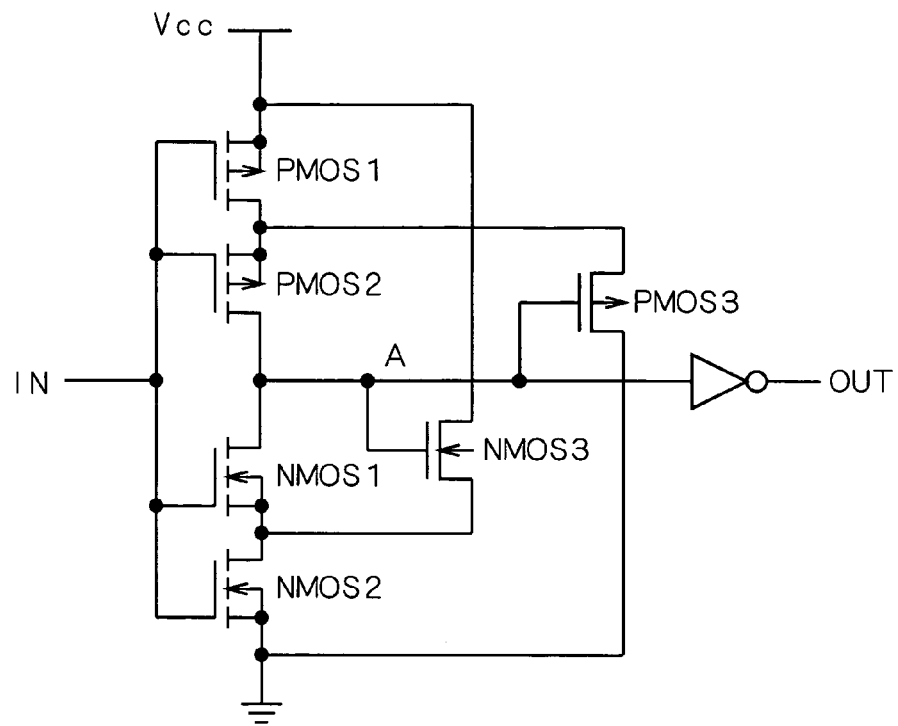
F I G . 2 2
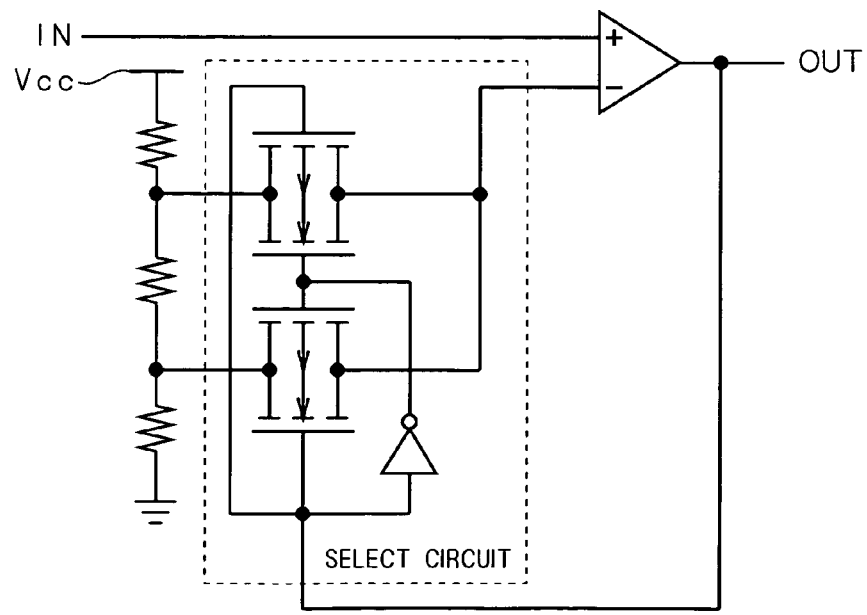

SEMICONDUCTOR CIRCUIT

BACKGROUND OF THE INVENTION

1. Field of the Invention

The present invention relates to semiconductor circuits, and particularly to a semiconductor circuit having a filter function.

2. Description of the Background Art

There are conventional semiconductor circuits that have a noise filter function and a signal delay function. Such a conventional semiconductor circuit includes a plurality of inverter circuits connected in series and a capacitor connected between ground and a node between given ones of the inverter circuits.

Now, a time constant is determined by adjusting a capacitor and the inverter circuit preceding the capacitor.

In this conventional semiconductor circuit, the time constant is determined so that, at the node between the given inverter circuits, the signal rising inclination and the signal falling inclination differ from each other. For example, the time constant is determined so that the signal rises slowly and falls sharply.

Then a filter function is obtained by utilizing the difference between the signal rising inclination and the falling inclination and the threshold of the following inverter.

While related prior arts include the invention disclosed by Japanese Patent Application Laid-Open No. 7-95022 (1995: FIG. 1), the object of the invention described therein is not to obtain a filter function. That is to say, when a plurality of small-width noise pulses are successively superimposed on the input signal, it is difficult to properly filter off the noise pulses.

The conventional semiconductor circuit mentioned above is capable of filtering off only one of L-level noise superimposed during originally H signal periods and H-level noise superimposed during originally L signal periods.

SUMMARY OF THE INVENTION

An object of the present invention is to provide a semiconductor circuit capable of effectively applying a filter function to both of L-level noise superimposed during originally H signal periods and H-level noise superimposed during originally L signal periods.

According to the present invention, a semiconductor circuit includes a first delay circuit, a second delay circuit, a circuit portion, and a flip-flop. The first delay circuit includes a first integrating circuit. The second delay circuit includes a second integrating circuit. The circuit portion inputs an in-phase version and an inverted-phase version of an input signal individually to one and the other of the first and second delay circuits. The flip-flop receives an output signal from the first delay circuit and an output signal from the second delay circuit respectively at its first and second input terminals.

An in-phase signal is inputted to one delay circuit and an inverted-phase signal is inputted to the other delay circuit. Thus, when the input signal rises (or falls), that one delay circuit can judge whether the succeeding signal is noise or not on the basis of a filter time previously set in that delay circuit. When the input signal falls (or rises), the other delay circuit can judge whether the succeeding signal is noise or not on the basis of a filter time previously set in that other delay circuit. The signals outputted from the two delay circuits are merged in the flip-flop and provided as an output signal. It is therefore possible to effectively apply a filter function to both of L-level noise superimposed during originally H signal pulse periods and H-level noise superimposed during originally L signal pulse periods. The semiconductor circuit of the present invention can continuously observe the input signal during filter time periods using integrating circuits. Therefore, even when a plurality of small-width noise pulses are successively superimposed on the input signal, the semiconductor circuit can effectively filter off the plurality of noise pulses.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram of a semiconductor circuit according to a first preferred embodiment;

FIG. 7 is a diagram showing the operating logic of the flip-flop included in the semiconductor circuit of the third preferred embodiment;

FIG. 8 is a timing chart used to describe the operation of the semiconductor circuit of the third preferred embodiment;

FIGS. 21 to 23 are circuit diagrams showing specific configurations of conventional Schmitt circuits;

DESCRIPTION OF THE PREFERRED EMBODIMENTS

Figure 2:
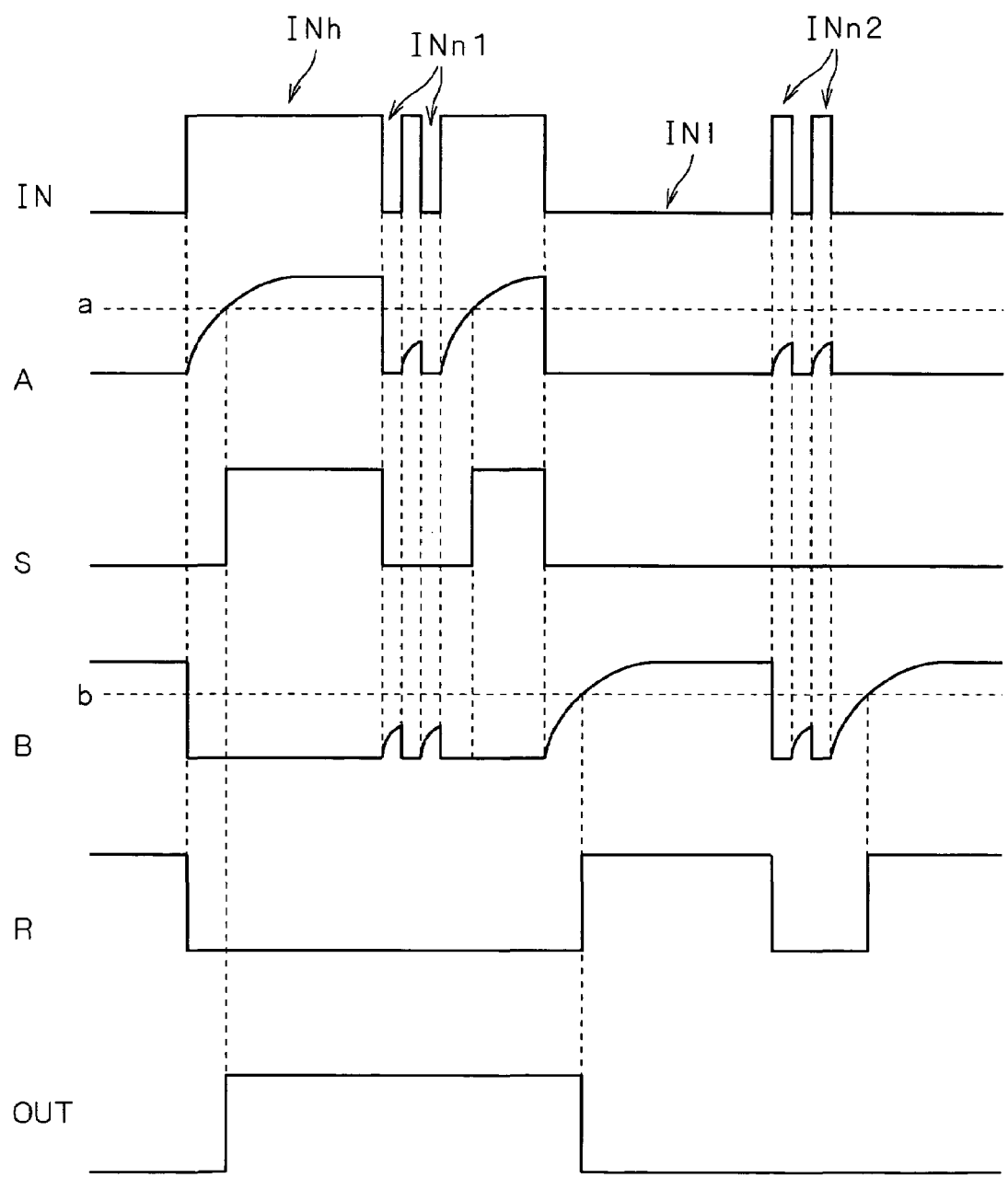
FIG. 2 is a timing chart used to describe the operation of the semiconductor circuit of the first preferred embodiment.

The present invention is now specifically described referring to the drawings illustrating the preferred embodiments.

<First Preferred Embodiment>

FIG. 1 is a circuit diagram of the semiconductor circuit according to a first preferred embodiment.

The semiconductor circuit of FIG. 1 includes two delay circuits 1 and 2, one flip-flop 3, and one signal inverting means 4. The delay circuits 1 and 2 each include an integrating circuit.

The first delay circuit 1 includes a plurality of (in this preferred embodiment, three) first inverter circuits 10 to 12 and a first capacitor 14 forming an integrating circuit. The signal inverting means 4 precedes the first delay circuit 1.

More specifically, the signal inverting means 4 and the three first inverter circuits 10 to 12 are series-connected in this order between an input terminal 5 receiving an input signal and the S input terminal of the flip-flop 3. The first capacitor 14 is connected between ground and a node N1 succeeding a given one of the first inverter circuits (in FIG. 1, the node N1 is located between the inverter circuit 10 and the inverter circuit 11).

The second delay circuit 2 is connected to a branch from a node N2 located between the input terminal 5 and the signal inverting means 4.

The second delay circuit 2 includes second inverter circuits 15 to 17 of the same number as the first inverter circuits 10 to 12 (in this preferred embodiment, three second inverter circuits 15 to 17) and a second capacitor 18 forming an integrating circuit.

More specifically, the three second inverter circuits 15 to 17 are connected in series between the node N2 and the R input terminal of the flip-flop 3. The second capacitor 18 is connected between ground and a node N3 succeeding a given one of the second inverter circuits (in FIG. 1, the node N3 is located between the inverter circuit 15 and the inverter circuit 16).

As shown in FIG. 1, since the signal inverting means 4 is disposed between the node N2 and the first delay circuit 1, the input signal provided to the first delay circuit 1 and the input signal provided to the second delay circuit 2 are in opposite phase.

The Q output terminal of the flip-flop 3 is connected to an output terminal 6.

Next, the operation of the semiconductor circuit of FIG. 1 is described referring to the timing chart of FIG. 2. As shown in FIG. 2, the input signal IN provided from the input terminal 5 contains L-level noise signals INn1 superimposed on an H-level signal pulse INh. Also, the input signal IN contains H-level noise signals INn2 superimposed on an L-level signal pulse IN1.

While some time delay occurs as the input signal IN passes through the inverter circuits, the timing chart of FIG. 2 does not show the time delay. In this preferred embodiment, in the first and second capacitors 14 and 18, the charging rate and the discharging rate differ from each other. That is, the semiconductor circuit, or the first and second capacitors 14 and 18 and the preceding inverter circuits 10 and 15 are designed so that the charging rate is slower and the discharging rate is rapider.

The timing chart of FIG. 2 assumes that no time delay is caused by discharging, since the discharging rate of the first and second capacitors 14 and 18 is fast.

First, how the signal varies in the first delay circuit 1 is described.

The input signal IN inputted from the input terminal 5 is inverted in phase as it passes through the signal inverting means 4 and inverted again through the first inverter circuit 10. Therefore the signal outputted from the first inverter circuit 10 is in phase with the input signal IN inputted to the input terminal 5.

That is to say, as the input signal IN rises, the signal output from the first inverter circuit 10 rises correspondingly. As the input signal IN falls, the signal output from the first inverter circuit 10 falls correspondingly.

Now, when the signal output from the first inverter circuit 10 rises, the first capacitor 14 starts a slow charge. On the other hand, when the signal output from the first inverter circuit 10 falls, the first capacitor 14 starts a rapid discharge.

Thus, as the signal output from the first inverter circuit 10 rises, the signal A inputted to the first inverter circuit 11 starts rising in a curve at a gentle inclination. When the signal output from the first inverter circuit 10 falls, the signal A inputted to the first inverter circuit 11 rapidly falls.

Thus, with the input signal IN of FIG. 2, the signal A inputted to the first inverter circuit 11 exhibits the waveform shown in FIG. 2.

That is to say, when the H-level signal pulse INh is provided as the input signal IN to the input terminal 5, the potential of the signal A correspondingly starts rising slowly in a curve. Then, while the signal pulse INh remains at the H level, the potential of the signal A keeps slowly rising to attain the H level over a threshold potential "a" previously set in the first inverter circuit 11, and it then keeps the H level.

The time period from when the signal A starts a slow potential rise to when the potential of the signal A reaches the threshold potential "a" is referred to as a filter time. The filter time is a time period for determining whether the input signal IN is the original pulse signal. That is, a pulse of the input signal IN shorter than the filter time is judged as noise. On the other hand, a pulse of the input signal IN longer than the filter time is judged as an original signal pulse.

Next, the L-level noise INn1 superimposed on the signal pulse INh is inputted from the input terminal 5. Then, as shown in FIG. 2, as the noise INn1 falls, the waveform of the signal A rapidly falls correspondingly. Then, while the noise INn1 remains at the L level, the signal A also holds the L level.

After the first noise signal INn1 has passed, the input signal IN regains and holds the original signal pulse INh until the input of the second noise signal INn1. Then, as the original signal pulse INh is restored, the waveform of the signal A correspondingly starts slowly rising in a curve.

However, since the time period between the end of the first noise signal INn1 and the input of the second noise signal INn1 is shorter than the filter time, the waveform of the signal A rapidly falls without reaching the threshold potential "a".

Subsequently, the waveform A keeps the L level while the second noise signal INn1 is present. After that, as the input signal IN regains the original signal pulse INh, the waveform of the signal A correspondingly starts rising slowly and curvedly.

The signal pulse INh then keeps the H level for a while and then falls, and the L-level signal pulse IN1 is provided as the input signal IN; correspondingly, the waveform of the signal A continues slowly rising and then falls rapidly.

After that, while the signal pulse IN1 remains at the L level, the waveform of the signal A also remains at the L level. The signal pulse IN1 contains noise INn2 shorter than the filter time. The noise INn2 causes the waveform of the signal A to vary like saw-teeth. The potential of the saw-toothed signal A does not reach the threshold potential "a" because the noise INn2 is shorter than the filter time.

The first inverter circuit 11 operates on the basis of the threshold potential "a". That is to say, when the potential of the signal A exceeds the threshold potential "a", the first inverter circuit 11 outputs an inverted L-level signal. Also, when the potential of the signal A goes below the threshold potential "a", the first inverter circuit 11 outputs an inverted H-level signal.

Accordingly, when the signal A shown in FIG. 2 is inputted to the first inverter circuit 11, the signal A, after passing through the first inverter circuits 11 and 12, changes to become the signal S shown in FIG. 2 and the signal S is inputted to the S input terminal of the flip-flop 3.

When the potential of the signal A exceeds the threshold potential "a", the signal S rises correspondingly. And when the potential of the signal A becomes lower than the threshold potential "a", the signal S falls correspondingly.

Next, how the signal varies in the second delay circuit 2 is described.

The input signal IN is inverted in phase in the second inverter circuit 15. Therefore the input signal IN provided to the input terminal 5 and the signal output from the second inverter circuit 15 are in opposite phase.

That is to say, as the input signal IN rises, the signal output from the second inverter circuit 15 falls correspondingly. As the input signal IN falls, the signal output from the second inverter circuit 15 rises correspondingly.

Now, when the signal output from the second inverter circuit 15 rises, the second capacitor 18 starts a slow charge. When the signal output from the second inverter circuit 15 falls, the second capacitor 18 starts a rapid discharge.

Thus, as the signal output from the second inverter circuit 15 rises, the signal B inputted to the second inverter circuit 16 starts rising in a curve at a gentle inclination. When the signal output from the second inverter circuit 15 falls, the signal B inputted to the second inverter circuit 16 rapidly falls.

Thus, with the input signal IN of FIG. 2, the signal B inputted to the second inverter circuit 16 exhibits the waveform shown in FIG. 2.

That is to say, when the H-level signal pulse INh is provided as the input signal IN to the input terminal 5, then the signal B rapidly falls correspondingly. Then, while the signal pulse INh remains at the H level, the signal B keeps the L level.

Next, the L-level noise INn1 superimposed on the signal pulse INh is inputted from the input terminal 5. Then, as shown in FIG. 2, as the noise INn1 falls, the waveform of the signal B correspondingly starts rising slowly and curvedly. Since the duration of the noise INn1 is shorter than the filter time, the signal B rapidly falls before reaching a threshold potential "b" previously set in the second inverter circuit 16.

The time period from when the signal B starts a slow potential rise to when the potential of the signal B reaches the threshold potential "b" is referred to as a filter time. The filter time is a time period for determining whether the input signal IN is the original pulse signal. That is, a pulse of the input signal IN shorter than the filter time is judged as noise. On the other hand, a pulse of the input signal IN longer than the filter time is judged as an original signal pulse.

The signal B keeps the L level until the input of the second noise INn1. Then, with the input of the second noise INn1, the signal B correspondingly starts rising slowly in a curve. However, since the duration of the noise INn1 is shorter than the filter time, the signal B rapidly falls before reaching the threshold potential "b".

Subsequently, since the input signal IN regains the original signal pulse INh, the waveform of the signal B also keeps the L level.

The signal pulse INh then keeps the H level for a while and then falls, and the L-level signal pulse IN1 is provided as the input signal IN; correspondingly, the waveform of the signal B starts rising slowly in a curve.

After that, while the signal pulse IN1 remains at the L level, the waveform of the signal B continues rising slowly beyond the threshold potential "b" to reach the H level, and then the signal B keeps the H level.

The signal pulse IN1 contains two noise signals INn2 shorter than the filter time. Therefore, at the rise of the first noise INn2, the waveform of the signal B falls, and then varies like a saw-tooth. The potential of the saw-tooth signal B does not reach the threshold potential "b". Then, as the input signal IN regains the original signal pulse IN1, the signal B correspondingly starts rising slowly in a curve beyond the threshold potential "b" to reach the H level, and then the signal B keeps the H level.

The second inverter circuit 16 operates on the basis of the threshold potential "b". That is to say, when the potential of the signal B exceeds the threshold potential "b", the second inverter circuit 16 outputs an inverted L-level signal. The second inverter circuit 16 outputs an inverted H-level signal when the potential of the signal B comes below the threshold potential "b".

Accordingly, when the signal B shown in FIG. 2 is inputted to the second inverter circuit 16, the signal B, after passing through the second inverter circuits 16 and 17, changes to become the signal R shown in FIG. 2 and the signal R is inputted to the R input terminal of the flip-flop 3.

When the potential of the signal B exceeds the threshold potential "b", the signal R rises correspondingly. When the potential of the signal B comes below the threshold potential "b", the signal R falls correspondingly.

Figures 3, 4:
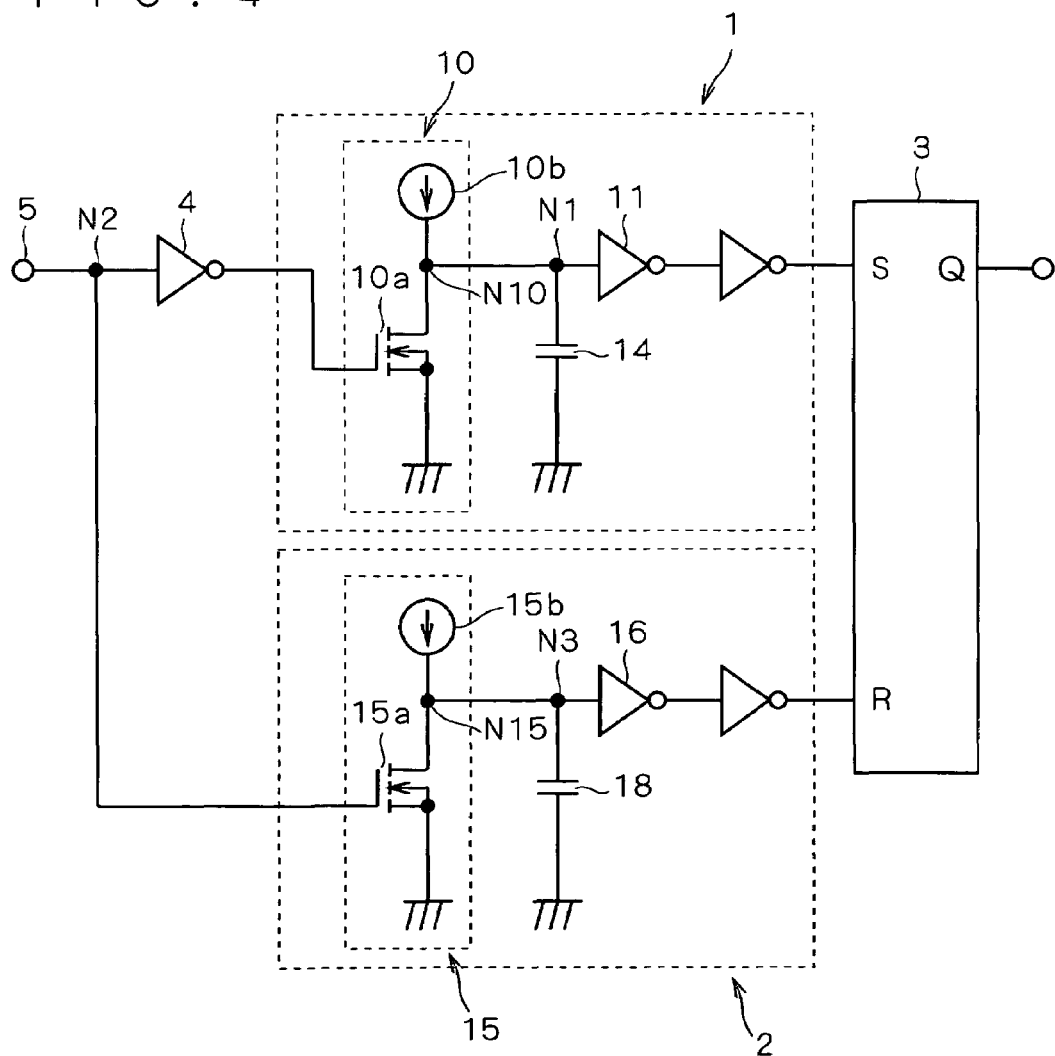
FIG. 3 is a diagram showing the operating logic of the flip-flop included in the semiconductor circuit of the first preferred embodiment.
FIG. 4 is a circuit diagram of a semiconductor circuit according to a second preferred embodiment.

The flip-flop 3 operates according to the logic table of FIG. 3.

That is to say, when the input of the signal S to the S input terminal is at the H level and the input of the signal R to the R input terminal is at the L level, the flip-flop 3 outputs a signal OUT at the H level from the Q output terminal. On the other hand, when the input of the signal S to the S input terminal is at the L level and the input of the signal R to the R input terminal is at the H level, the flip-flop 3 outputs a signal OUT at the L level from the Q output terminal.

When the signal inputs S and R to the S and R input terminals are both at the L level, then the Q output terminal continuously outputs the output signal OUT remaining at the previous output level.

As described so far, when the signals S and R as shown in FIG. 2 are supplied to the corresponding input terminals of the flip-flop 3, the Q output terminal of the flip-flop 3 outputs the output signal OUT as shown in FIG. 2.

As can be seen from FIG. 2, with the semiconductor circuit of this preferred embodiment (FIG. 1), the noise INn1 and INn2 superimposed on the input signal IN are absent in the output signal OUT.

As mentioned earlier, the input signal IN from the input terminal 5 is provided to one delay circuit 1 after being inverted in phase by the signal inverting means 4, while the intact input signal IN is provided to the other delay circuit 2.

Then, when the input signal IN rises, that one delay circuit 1 judges whether the following signal is noise or not on the basis of the filter time previously set in that delay circuit 1 (that is, it continuously observes the input signal during the filter time to determine whether the pulse signal following the rise is noise or not).

On the other hand, when the input signal IN falls, the other delay circuit 2 judges whether the following signal is noise or not on the basis of the filter time previously set in that delay circuit 2 (that is, it continuously observes the input signal during the filter time to determine whether the pulse signal following the fall is noise or not).

Subsequently, the signals S and R outputted from the two delay circuits 1 and 2 are merged in the flip-flop 3 to provide the output signal OUT.

Thus, the use of the semiconductor circuit of this preferred embodiment effectively provides a filter function of both of L-level noise superimposed during original H signal pulse periods and H-level noise superimposed during original L signal pulse periods.

The semiconductor circuit of this preferred embodiment uses integrating circuits (the capacitors 14 and 18) to continuously observe the input signal during filter time periods to decide whether pulse signals are noise or not. Also, the potential variation rates at the integrating circuits (the capacitors 14 and 18) are defined so that the potential varies more rapidly when falling than when rising, which makes it possible to effectively filter off noise even when a plurality of small-width noise pulses are successively superimposed on the input signal.

<Second Preferred Embodiment>

FIG. 4 shows the semiconductor circuit according to a second preferred embodiment.

As can be seen from FIG. 4, in the semiconductor circuit of this preferred embodiment, the inverter circuits 10 and 15, which respectively precede the capacitors 14 and 18 as shown in FIG. 1, are formed of NMOSs 10a and 15a and constant-current circuits 10b and 15b, respectively.

That is to say, the first inverter circuit 10 is configured as follows. The output of the signal inverting means 4 is connected to the gate electrode of the NMOS 10a. The drain of the NMOS 10a is connected to the constant-current circuit 10b. The source of the NMOS 10a is connected to ground. A node N10, located between the drain of the NMOS 10a and the constant-current circuit 10b, is connected to the node N1.

The constant-current circuit 10b operates to cause a constant current to flow to the NMOS 10a.

The second inverter circuit 15 is configured as follows. The node N2 is connected to the gate electrode of the NMOS 15a. The drain of the NMOS 15a is connected to the constant-current circuit 15b. The source of the NMOS 15a is connected to ground. A node N15, located between the drain of the NMOS 15a and the constant-current circuit 15b, is connected to the node N3.

The constant-current circuit 15b operates to cause a constant current to flow to the NMOS 15a.

In other respects, the configuration is the same as that of FIG. 1 and therefore not described again here.

Figure 5:
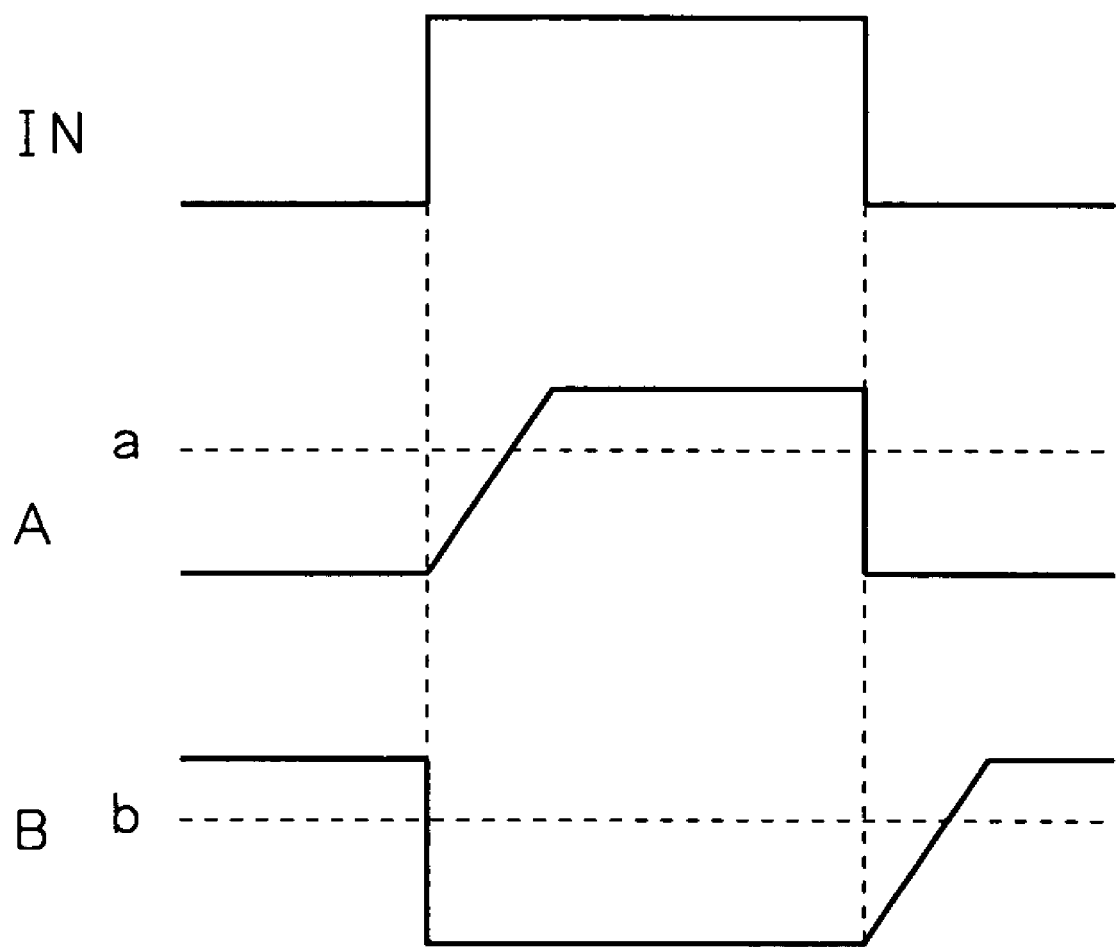
FIG. 5 is a timing chart used to describe the operation of the semiconductor circuit of the second preferred embodiment.

Next, the operation of the semiconductor circuit of FIG. 4 is described referring to the timing chart of FIG. 5. First, the operation of the first delay circuit 1 is described.

At the input terminal 5, an H-level signal rises and an H-level input signal IN is inputted, which is inverted by the signal inverting means 4. Therefore an L-level signal is inputted to the gate electrode of the NMOS 10a. The NMOS 10a thus turns off and the constant current from the constant-current circuit 10b flows to the first capacitor 14 through the nodes N10 and N1. That is to say, at the rise of the H-level input signal IN, the first capacitor 14 starts charging slowly and linearly, which ends after a given time has passed.

Thus, as the H-level input signal IN shown in FIG. 5 is provided to the input terminal 5, the signal A inputted to the first inverter circuit 11 varies as shown in FIG. 5. That is, as the input signal IN rises, the waveform of the signal A correspondingly starts rising slowly and linearly. Then it exceeds the threshold potential "a" previously set in the first inverter circuit 11 to reach the H level, and the signal A keeps the H level.

Next, the H-level input signal IN falls and an L-level input signal IN is provided to the input terminal 5, and then the L-level input signal IN is inverted to the H level by the signal inverting means 4.

The inverted H-level signal is inputted to the gate electrode of the NMOS 10a to cause the NMOS 10a to turn on. Therefore the constant current from the constant-current circuit 10b flows to ground through the NMOS 10a and the charge accumulated in the first capacitor 14 is rapidly discharged to ground through the NMOS 10a.

Accordingly, when the L-level input signal IN shown in FIG. 5 is provided to the input terminal 5, the signal A inputted to the first inverter circuit 11 varies as shown in FIG. 5. That is to say, as the input signal IN falls, the waveform of the signal A rapidly falls correspondingly. It thus becomes lower than the threshold potential "a" to reach the L level, and then the signal A keeps the L level.

Next, the operation of the second delay circuit 2 is described.

At the input terminal 5, the H-level signal rises and the H-level input signal IN is inputted, then the NMOS 15a turns on. Therefore the constant current from the constant-current circuit 15b flows to ground through the NMOS 15a and the charge accumulated in the second capacitor 18 is rapidly discharged to ground through the NMOS 15a.

Thus, as the H-level input signal IN shown in FIG. 5 is provided to the input terminal 5, the signal B inputted to the second inverter circuit 16 varies as shown in FIG. 5. That is, as the input signal IN rises, the waveform of the signal B rapidly falls correspondingly. It thus becomes lower than the threshold potential "b" previously set in the second inverter circuit 16 to reach the L level, and the signal B keeps the L level.

Next, the H-level input signal IN falls and then the L-level input signal IN is provided to the input terminal 5, and so the NMOS 15a turns off. Therefore the constant current from the constant-current circuit 15b flows to the second capacitor 18 through the nodes N15 and N3. That is to say, at the fall of the H-level input signal IN, the second capacitor 18 starts charging slowly and linearly, which ends after a given time has passed.

Thus, as the L-level input signal IN shown in FIG. 5 is provided to the input terminal S, the signal B inputted to the second inverter circuit 16 varies as shown in FIG. 5. That is, as the input signal IN falls, the waveform of the signal B correspondingly starts rising slowly and linearly. It then exceeds the threshold potential "b" to reach the H level, and then the signal B keeps the H level.

As can be seen from FIGS. 2 and 5, the signals A and B linearly rise from the L level to H level in the semiconductor circuit of this preferred embodiment, while the signals A and B rise curvedly in the semiconductor circuit of the first preferred embodiment.

Thus, in the semiconductor circuit of this preferred embodiment, because the signals A and B linearly rise, it is easy to set the filter time from when the signals A and B start a linear potential rise to when the signals A and B attain the threshold potentials "a" and "b", respectively. This offers improved noise judgement.

Furthermore, it is possible to configure the semiconductor circuit of this preferred embodiment to realize level shifting, as well as the noise filter function, by setting different potential values between the circuit portion following the constant-current circuits 10b and 15b (components shown by the reference numerals 11, 16, 3, etc.) and the power-supply of the stage preceding the NMOSs 10a and 15a.

Needless to say, the semiconductor circuit of this preferred embodiment provides the same effects that the semiconductor circuit of the first preferred embodiment provides.

<Third Preferred Embodiment>

Figure 6:
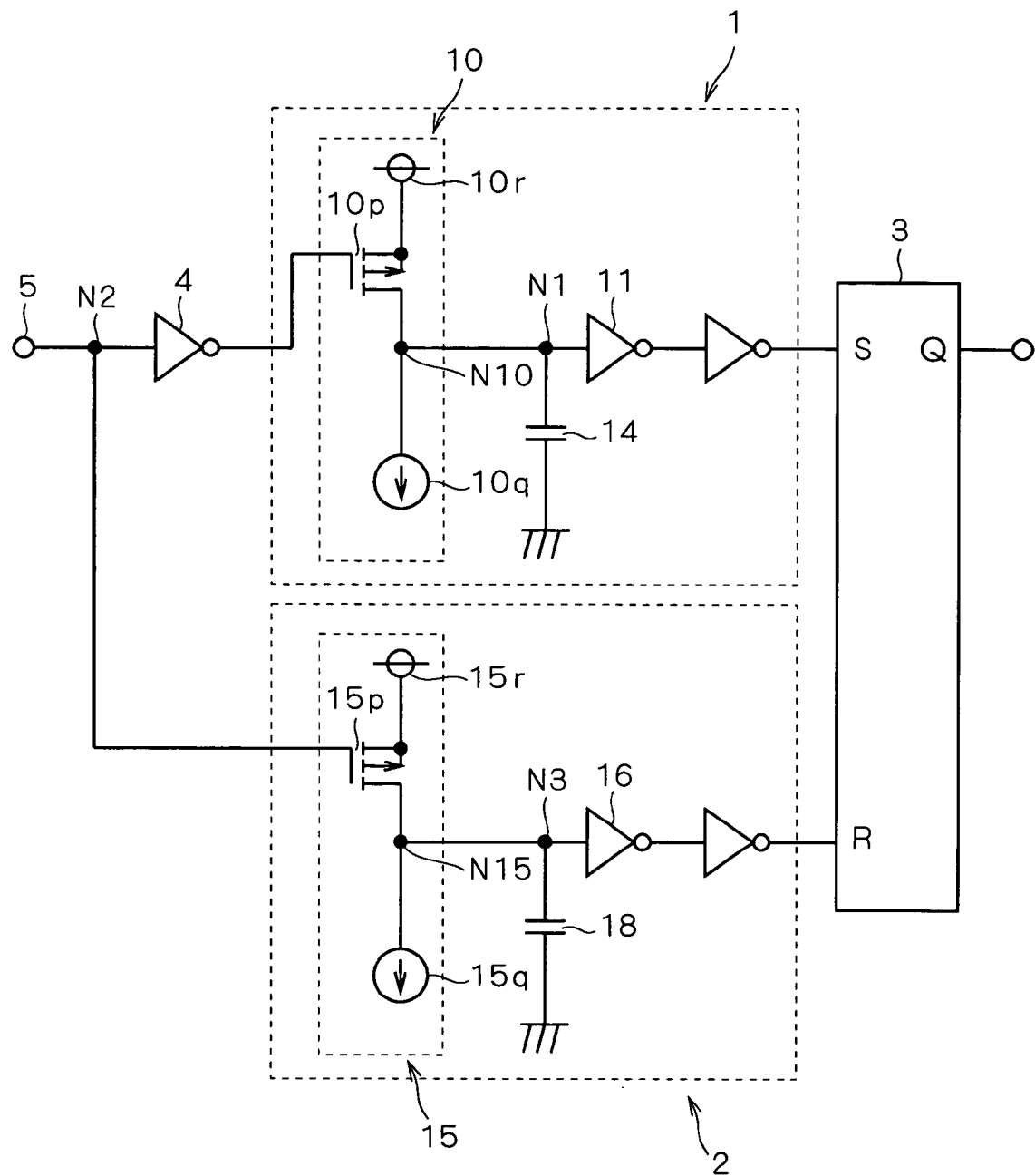
FIG. 6 is a circuit diagram of a semiconductor circuit according to a third preferred embodiment.

FIG. 6 shows the semiconductor circuit according to a third preferred embodiment.

As can be seen from FIG. 6, in the semiconductor circuit of this preferred embodiment, the inverter circuits 10 and 15, which precede the capacitors 14 and 18 as shown in FIG. 1, are formed of PMOSs 10p and 15p, constant-current circuits 10q and 15q, and fixed power-supplies 10r and 15r, respectively.

That is to say, the first inverter circuit 10 is configured as follows. The output of the signal inverting means 4 is connected to the gate electrode of the PMOS 10p. The drain of the PMOS 10p is connected to the constant-current circuit 10q. The source of the PMOS 10p is connected to the fixed power-supply 10r. A node N10, located between the drain of the PMOS 10p and the constant-current circuit 10q, is connected to the node N1.

The second inverter circuit 15 is configured as follows. The node N2 is connected to the gate electrode of the PMOS 15p. The drain of the PMOS 15p is connected to the constant-current circuit 15q. The source of the PMOS 15p is connected to the fixed power-supply 15r. A node N15, located between the drain of the PMOS 15p and the constant-current circuit 15q, is connected to the node N3.

The constant-current circuits 10q and 15q operate to extract constant current in a direction opposite to the direction of the PMOSs 10p and 15p.

The semiconductor circuit of this preferred embodiment adopts a flip-flop 3 that operates on the basis of the logic table shown in FIG. 7. The output of the first delay circuit 1 is connected to the S' input terminal of the flip-flop 3 and the output of the second delay circuit 2 is connected to the R' input terminal of the flip-flop 3.

The flip-flop 3 of the semiconductor circuit of the first preferred embodiment is replaced by the flip-flop 3 operating according to the logic table of FIG. 7 in order to utilize the operation that, when the signals inputted to the S' and R' input terminals are both at the H level, the flip-flop 3 keeps the previous output logic state that it took before the signal inputs to the S' and R' input terminals both attain the H level.

That is to say, with the semiconductor circuit of this preferred embodiment, the time constant of the capacitors 14 and 18 varies. That is to say, the capacitors 14 and 18 are charged rapidly and discharged linearly and slowly. Therefore H-level periods of the signal input to one input terminal of the flip-flop 3 and H-level periods of the signal input to the other input terminal overlap partly.

For example, in the timing chart shown in FIG. 2, immediately after the input signal IN varies from the L level to H level and immediately after it varies from the H level to L level, the S input terminal and the R input terminal of the flip-flop 3 are both at the L level, and, according to the logic table of FIG. 3, the output signal OUT of the flip-flop 3 remains at the level it took before the variation of the input signal IN.

Similarly, in the semiconductor circuit of the this preferred embodiment, since the flip-flop 3 operates according to the logic table of FIG. 7, when both inputs to the flip-flop 3 overlap at the H level, then the output state of the flip-flop 3 remains unchanged from before the overlap.

In the semiconductor circuit of this preferred embodiment, when the input signal IN falls, the first delay circuit 1 judges whether the succeeding signal is noise or not on the basis of the filter time previously set in the first delay circuit 1 (that is, it continuously observes the input signal during the filter time so as to determine whether the pulse signal following the fall is noise or not).

On the other hand, when the input signal IN rises, the second delay circuit 2 judges whether the succeeding signal is noise or not on the basis of the filter time previously set in the second delay circuit 2 (that is, it continuously observes the input signal during the filter time so as to determine whether the pulse signal following the rise is noise or not).

In other respects, the configuration is the same as that of FIG. 1 and therefore not described again here. When the input signal IN and the output signal from the flip-flop 3 are to be in the same phase, the input terminals may be connected in reverse relation, or a signal inverting means may be provided to follow the flip-flop 3.

Next, the operation of the semiconductor circuit of FIG. 6 is described referring to the timing chart of FIG. 8. First, the operation of the first delay circuit 1 is described.

At the input terminal 5, an H-level signal rises and an H-level input signal IN is inputted, which is inverted by the signal inverting means 4. Therefore an L-level signal is inputted to the gate electrode of the PMOS 10p. This turns on the PMOS 10p and then the potential of the node N1 rapidly goes to the potential of the fixed power-supply 10r and the first capacitor 14 is charged rapidly.

Thus, as the H-level input signal IN shown in FIG. 8 is provided to the input terminal 5, the signal A inputted to the first inverter circuit 11 varies as shown in FIG. 8. That is, as the input signal IN rises, the waveform of the signal A rapidly rises correspondingly, and the potential of the signal A exceeds the threshold potential "a" previously set in the first inverter circuit 11 to reach the H level, and then the signal A keeps the H level.

Next, the H-level input signal IN falls and an L-level input signal IN is inputted to the input terminal 5, and then the L-level input signal IN is inverted to the H level by the signal inverting means 4.

The inverted H-level signal is inputted to the gate electrode of the PMOS 10p to cause the PMOS 10p to turn off. Therefore the constant-current circuit 10q extracts current and the charge accumulated in the first capacitor 14 starts discharging linearly and slowly.

Accordingly, when the L-level input signal IN shown in FIG. 8 is inputted to the input terminal 5, the signal A inputted to the first inverter circuit 11 varies as shown in FIG. 8. That is to say, as the input signal IN falls, the waveform of the signal A correspondingly starts falling slowly and linearly. It thus becomes lower than the threshold potential "a" to reach the L level, and then the signal A keeps the L level.

Next, the operation of the second delay circuit 2 is described.

When the H-level input signal IN is inputted to the input terminal 5, the PMOS 15*p* turns off. Then the constant-current circuit 15*b* extracts current and the charge accumulated in the second capacitor 18 starts discharging linearly.

Thus, as the H-level input signal IN shown in FIG. 8 is provided to the input terminal 5, the signal B inputted to the second inverter circuit 16 varies as shown in FIG. 8. That is, as the input signal IN rises, the waveform of the signal B linearly falls correspondingly. It then becomes lower than the threshold potential "b" previously set in the second inverter circuit 16 to reach the L level, and then the signal B keeps the L level.

Next, the H-level input signal IN falls and the L-level input signal IN is inputted to the input terminal 5, and then the PMOS 15*p* turns on. Therefore the potential of the node N3 rapidly goes to the potential of the fixed power-supply 15*r* and the second capacitor 18 is charged.

Thus, as the L-level input signal IN shown in FIG. 8 is provided to the input terminal 5, the signal B inputted to the second inverter circuit 16 varies as shown in FIG. 8. That is, as the input signal IN falls, the waveform of the signal B rapidly rises correspondingly, and the potential of the signal B exceeds the threshold potential "b" to reach the H level, and then the signal B keeps the H level.

Thus, when the L-level input signal IN shown in FIG. 8 is provided to the input terminal 5, the signal B inputted to the second inverter circuit 16 varies as shown in FIG. 8. That is to say, as the input signal IN falls, the waveform of the signal B correspondingly starts rising rapidly. Then it exceeds the threshold potential "b" to reach the H level and then the signal B keeps the H level.

As can be seen from FIGS. 2 and 8, while the signals A and B curvedly rise from the L level to H level in the semiconductor circuit of the first preferred embodiment, the signals A and B fall linearly from the H level to L level in the semiconductor circuit of this preferred embodiment.

Thus, in the semiconductor circuit of this preferred embodiment, because the signals A and B linearly fall, it is easy to set the filter time from when the signals A and B start a linear potential fall to when the signals A and B attain the threshold potentials "a" and "b", respectively. This offers improved noise judgement.

Furthermore, like the semiconductor circuit of the second preferred embodiment, it is possible to configure the semiconductor circuit of this preferred embodiment to realize level shifting on the negative electrode side, as well as the noise filter function, by setting different potential values on the negative electrode side between the circuit portion following the constant-current circuits 10*q* and 15*q* (components shown at the reference numerals 11, 16, 3, etc.) and the circuit portion of the stage preceding the PMOSs 10*p* and 15*p*.

Needless to say, the semiconductor circuit of this preferred embodiment provides the same effects that the semiconductor circuit of the first preferred embodiment provides.

<Fourth Preferred Embodiment>

Figure 9:
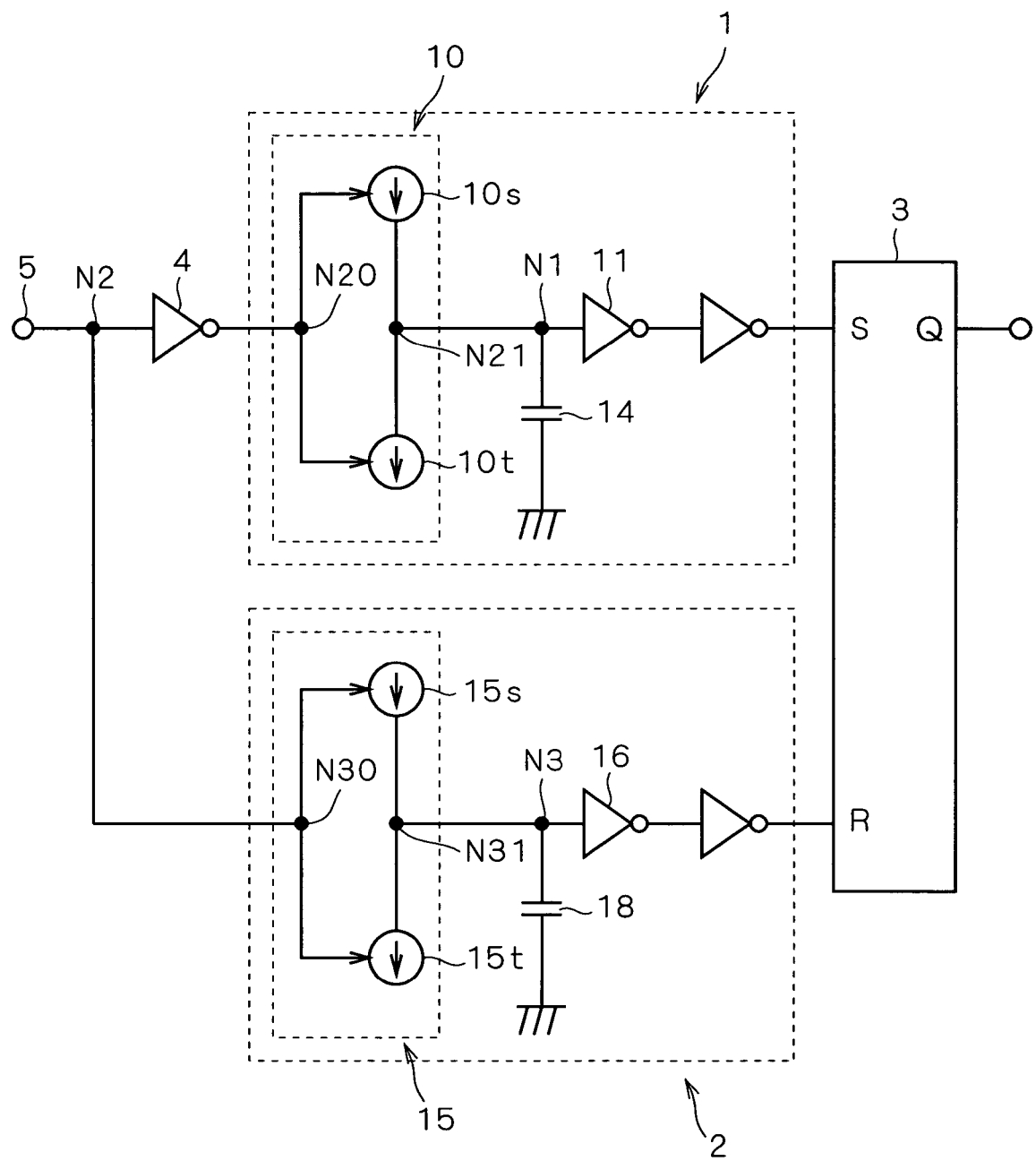
FIG. 9 is a circuit diagram of a semiconductor circuit according to a fourth preferred embodiment.

FIG. 9 shows the semiconductor circuit according to a fourth preferred embodiment.

As can be seen from FIG. 9, in the semiconductor circuit of this preferred embodiment, the inverter circuits 10 and 15, which respectively precede the capacitors 14 and 18 as shown in FIG. 1, are formed as circuits respectively including two constant-current circuits 10*s* and 10*t*, and 15*s* and 15*t*.

That is to say, the first inverter circuit 10 is configured as follows. The output of the signal inverting means 4 branches at a node N20 and is connected respectively to the constant-current circuits 10*s* and 10*t*. The outputs of the two constant-current circuits 10*s* and 10*t* are connected together at a node N21. The node N21 is connected to the node N1.

The second inverter circuit 15 is configured as follows. The node N2 is connected to a node N30 and branches off to the constant-current circuits 15*s* and 15*t*. The outputs of the two constant-current circuits 15*s* and 15*t* are connected together at a node N31. The node N31 is connected to the node N3.

The constant-current circuit 10*s* (or 15*s*) and the constant-current circuit 10*t* (or 15*t*) operate in an alternative manner on the basis of the potential of the node N20 (or N30).

That is to say, the constant-current circuit 10*s* (15*s*) operates when the potential of the node N20 (N30) is at the L level, in which case the constant-current circuit 10*t* (15*t*) does not operate. On the other hand, the constant-current circuit 10*t* (15*t*) operates when the potential of the node N20 (N30) is at the H level, in which case the constant-current circuit 10*s* (15*s*) does not operate.

The constant-current circuits 10*s* and 15*s* operate to cause constant current to flow into the semiconductor circuit and the constant-current circuits 10*t* and 15*t* operate to extract constant current from the semiconductor circuit.

In other aspects, the configuration is the same as that of FIG. 1 and therefore not described here again.

Figure 10:
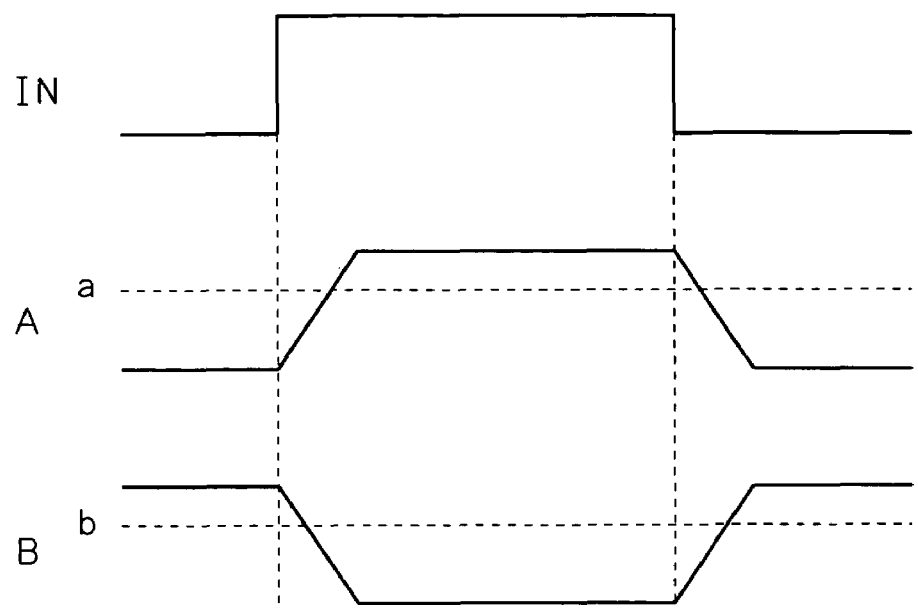
FIG. 10 is a timing chart used to describe the operation of the semiconductor circuit of the fourth preferred embodiment.

Next, the operation of the semiconductor circuit of FIG. 9 is described referring to the timing chart of FIG. 10. First, the operation of the first delay circuit 1 is described.

At the input terminal 5, an H-level signal rises and an H-level input signal IN is inputted, which is inverted by the signal inverting means 4. Therefore the node N20 goes to the L level. When the node N20 reaches the L level, the constant-current circuit 10*s* operates while the constant-current circuit 10*t* does not operate, so that the constant current from the constant-current circuit 10*s* flows to the first capacitor 14 through the nodes N21 and N1. That is to say, at the rise of the H-level input signal IN, the first capacitor 14 correspondingly starts charging slowly and linearly, which ends after a given time has passed.

Thus, as the H-level input signal IN shown in FIG. 10 is provided to the input terminal 5, the signal A inputted to the first inverter circuit 11 varies as shown in FIG. 10. That is, as the input signal IN rises, the waveform of the signal A correspondingly starts rising slowly and linearly. Then it exceeds the threshold potential "a" previously set in the first inverter circuit 11 to reach the H level, and the signal A keeps the H level.

Next, the H-level input signal IN falls and an L-level input signal IN is provided to the input terminal 5, and then the L-level input signal IN is inverted to the H level by the signal inverting means 4.

This causes the node N20 to go to the H level. When the node N20 reaches the H level, the constant-current circuit 10*t* operates while the constant-current circuit 10*s* does not operate, so that the constant-current extracting operation by the constant-current circuit 10*t* causes the charge accumulated in the first capacitor 14 to linearly discharge through the nodes N21 and N1. That is to say, at the fall of the H-level input signal IN, the first capacitor 14 correspondingly starts discharging slowly and linearly, which ends after a given time has passed.

Accordingly, when the L-level input signal IN shown in FIG. 10 is provided to the input terminal 5, the signal A inputted to the first inverter circuit 11 varies as shown in FIG. 10. That is to say, as the input signal IN falls, the waveform of the signal A correspondingly starts falling slowly and linearly. It thus becomes lower than the threshold potential "a" to reach the L level, and then the signal A keeps the L level.

Next, the operation of the second delay circuit 2 is described.

At the input terminal 5, the signal rises to the H level and the H-level input signal IN is inputted, and the node N30 goes to the H level. When the node N30 reaches the H level, the constant-current circuit 15t operates while the constant-current circuit 15s does not operate, so that the constant-current extracting operation by the constant-current circuit 15t causes the charge accumulated in the second capacitor 18 to linearly discharge through the nodes N31 and N3. That is to say, at the rise of the H-level input signal IN, the second capacitor 18 correspondingly starts discharging slowly and linearly, which ends after a given time has passed.

Accordingly, when the H-level input signal IN shown in FIG. 10 is inputted to the input terminal 5, the signal B inputted to the second inverter circuit 16 varies as shown in FIG. 10. That is to say, as the input signal IN rises, the waveform of the signal B correspondingly starts falling slowly and linearly. It thus becomes lower than the threshold potential "b" previously set in the second inverter circuit 16 to reach the L level, and then the signal B keeps the L level.

Next, the H-level input signal IN falls and the L-level input signal IN is inputted to the input terminal 5, which causes the node N30 to go to the L level. When the node N30 reaches the L level, the constant-current circuit 15s operates while the constant-current circuit 15t does not operate, so that the constant current from the constant-current circuit 15s flows to the second capacitor 18 through the nodes N31 and N3. That is to say, at the fall of the H-level input signal IN, the second capacitor 18 correspondingly starts charging slowly and linearly, which ends after a given time has passed.

Thus, as the H-level input signal IN shown in FIG. 10 is inputted to the input terminal 5, the signal B inputted to the second inverter circuit 16 varies as shown in FIG. 10. That is, as the input signal IN falls, the waveform of the signal B correspondingly starts rising slowly and linearly. Then it exceeds the threshold potential "b" to reach the H level, and the signal B keeps the H level.

Thus, with the semiconductor circuit of this preferred embodiment, at the nodes N1 and N3, the signals A and B linearly rise from the L level to H level, and also linearly fall from the H level to L level. This facilitates the definition of duty of filterable noise signals.

That is to say, when noise signals are successively superimposed on an input signal, perfectly filtering off the second and subsequent noise signals requires that, e.g. with the signal A (B) in FIG. 2, the discharge be completed before the input of the second noise signal after the disappearance of the first noise signal.

In the timing chart of FIG. 2, whether the discharge of the signal A (B) completes before the input of the second noise signal depends on which of the noise duty and the ratio between charging and discharging currents of the capacitors 14 and 18 is larger, where the border resides at the point where the two are equal.

While FIG. 2 shows the discharge of the signal A (B) achieved instantaneously, the actual signal A (B) falls in a curve also when discharging.

However, in this preferred embodiment, since both charging and discharging of the signal A (B) are achieved with constant current, its rise and fall are both linear. Accordingly, in the semiconductor circuit of this preferred embodiment, it is easier to calculate the ratio between charging and discharging currents than in the first to third preferred embodiments.

This makes it easier to define the duty of filterable (successive) noise.

Furthermore, as well as the semiconductor circuits of the second and third preferred embodiments, the semiconductor circuit of this preferred embodiment provides a level shifting function, in addition to the same effect (filter function) that the semiconductor circuit of the first preferred embodiment provides.

Figure 11:
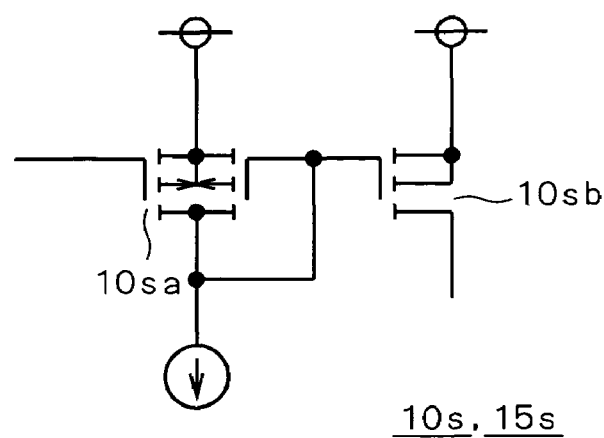
FIGS. 11 and 12 are circuit diagrams showing specific configurations of constant-current circuits.
Figure 12:
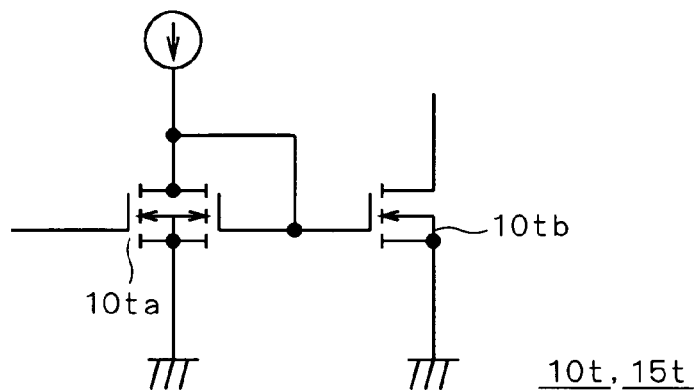

The circuit diagram of FIG. 9 conceptually shows the semiconductor circuit of this preferred embodiment. FIG. 11 shows an example of a specific circuit diagram of the constant-current circuits 10s and 15s of FIG. 9. FIG. 12 shows an example of a specific circuit diagram of the constant-current circuits 10t and 15t of FIG. 9.

In FIG. 11, a transistor 10sa forms a reference circuit; when current flows through this reference circuit as the transistor 10sa turns on/off, a transistor 10sb turns on in the dependent circuit which cooperates with the reference circuit and forms a current mirror, and then current flows to charge the capacitors 14 and 18.

In FIG. 12, a transistor 10ta forms a reference circuit; when current flows to this reference circuit as the transistor 10ta turns on/off, a transistor 10tb turns on in the dependent circuit which cooperates with the reference circuit and forms a current mirror, and then current flows to discharge the capacitors 14 and 18.

Figure 13:
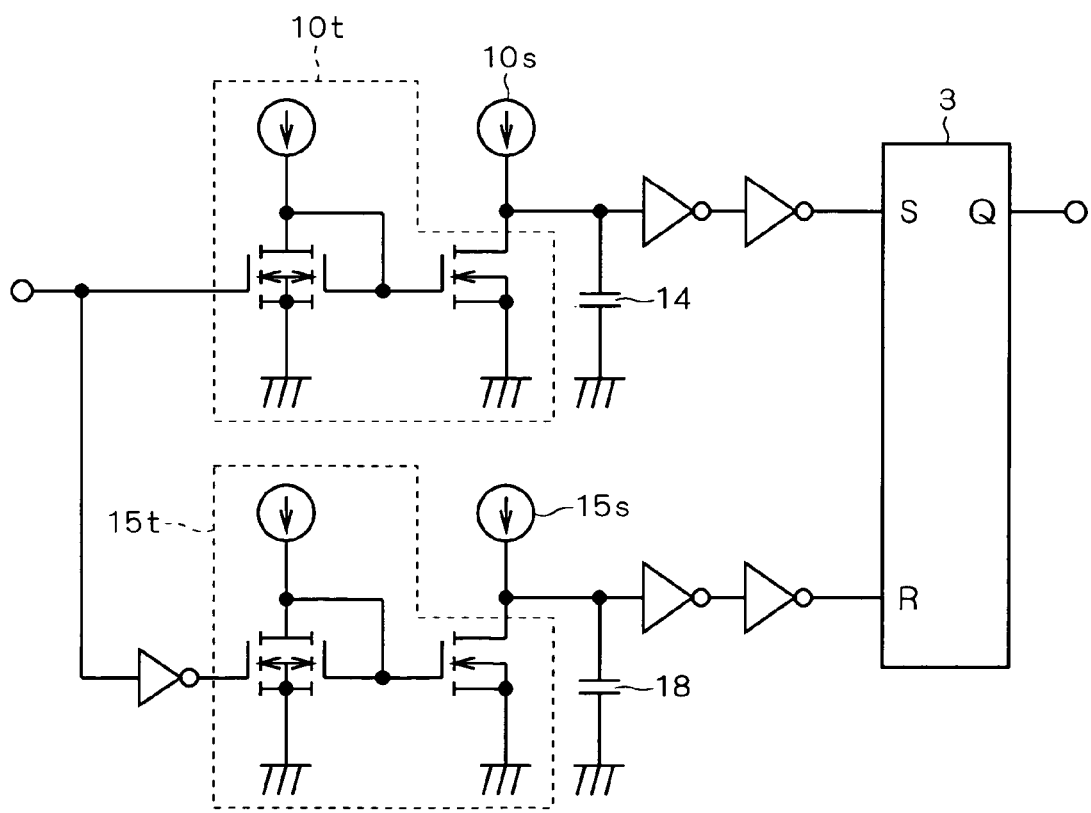
FIGS. 13 and 14 are circuit diagrams showing specific circuit configurations of other examples of the semiconductor circuit of the fourth preferred embodiment.
Figure 14:
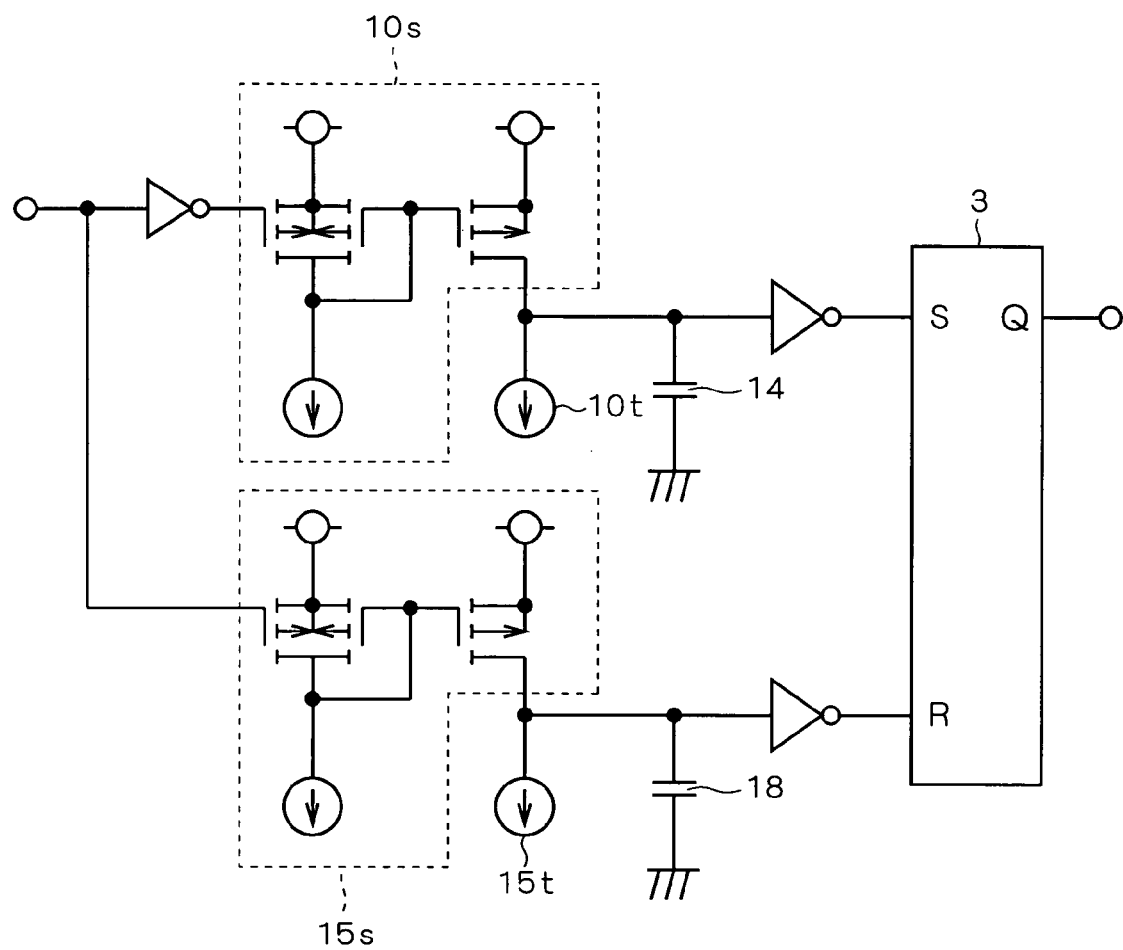

While the description above has shown an example in which both the constant-current circuit 10s (or 15s) and the constant-current circuit 10t (or 15t) perform switching operation, the circuitry may be configured so that only one of them operates on the basis of a signal inputted from a preceding stage. FIGS. 13 and 14 show examples of specific circuit diagrams in this case.

FIG. 13 shows a circuit configuration in which the constant-current circuits 10t and 15t operate on the basis of a signal inputted from the preceding stage, where the constant-current circuits 10s and 15s steadily provide a flow of constant current without switching operation. The circuit configuration of FIG. 13 requires that the constant current extracted by the constant-current circuits 10t and 15t be larger than the constant current flowing from the constant-current circuits 10s and 15s.

FIG. 14 shows a circuit configuration in which the constant-current circuits 10s and 15s operate on the basis of a signal inputted from the preceding stage, where the constant-current circuits 10t and 15t steadily extract constant current without switching operation. The circuit configuration of FIG. 14 requires that the constant current extracted by the constant-current circuits 10t and 15t be smaller than the constant current flowing from the constant-current circuits 10s and 15s.

<Fifth Preferred Embodiment>

The semiconductor circuit of a fifth preferred embodiment is characterized in that a plurality of the semiconductor circuits of the first preferred embodiment are connected in series to increase the delay time of the output signal with respect to the input signal.

Figure 15:
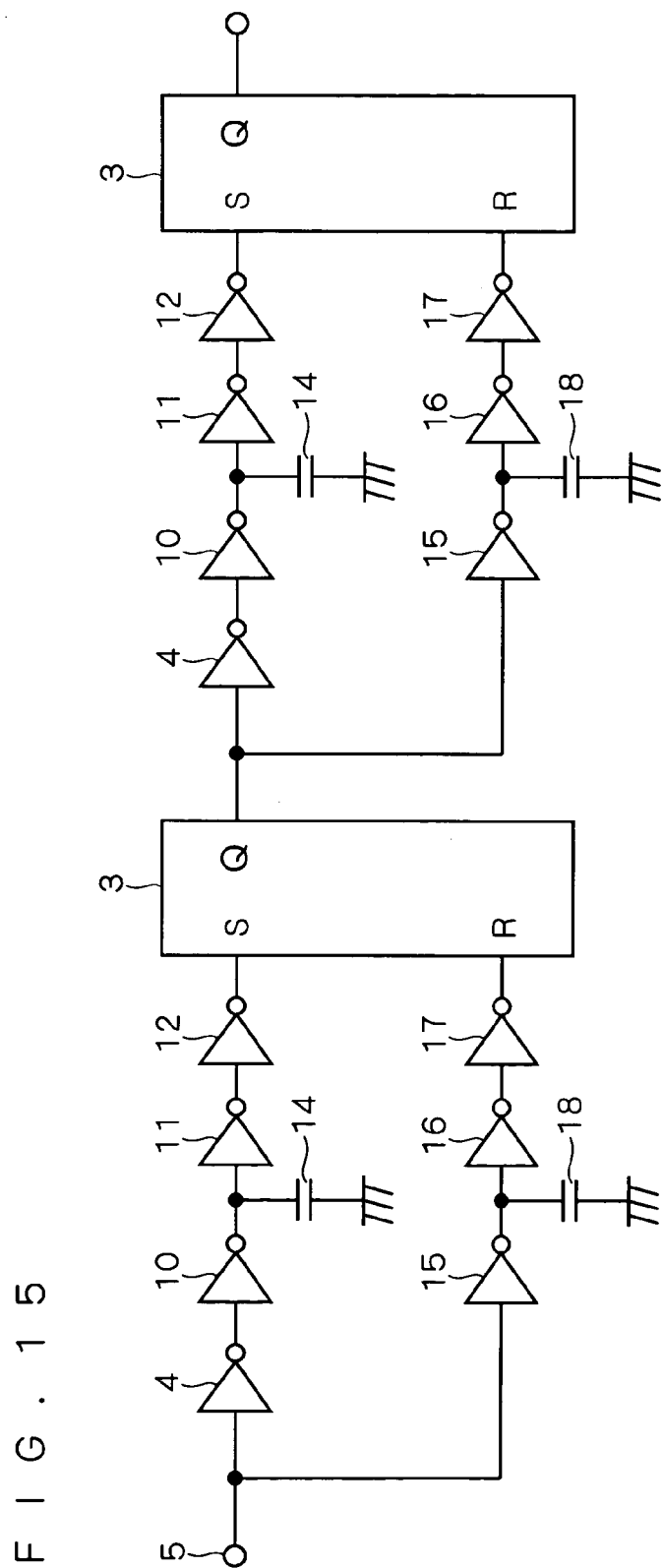
FIG. 15 is a circuit diagram of a semiconductor circuit according to a fifth preferred embodiment.

FIG. 15 is a circuit diagram of a semiconductor circuit of this preferred embodiment. While FIG. 15 shows a series connection of two stages of semiconductor circuits of the first preferred embodiment, the number of stages is not limited to two. As shown in FIG. 15, the Q output terminal of the flip-flop 3 of the stage preceding semiconductor circuit is connected to an input terminal (not shown in FIG. 15) of the following semiconductor circuit. The configuration of each semiconductor circuit stage is the same as that of the first preferred embodiment and therefore not described here again.

The use of the semiconductor circuit of this preferred embodiment makes it possible to cause the Q output terminal of the flip-flop circuit 3 of the final stage to output an output signal OUT without reducing or eliminating the pulse width of the input signal IN.

Figure 16:
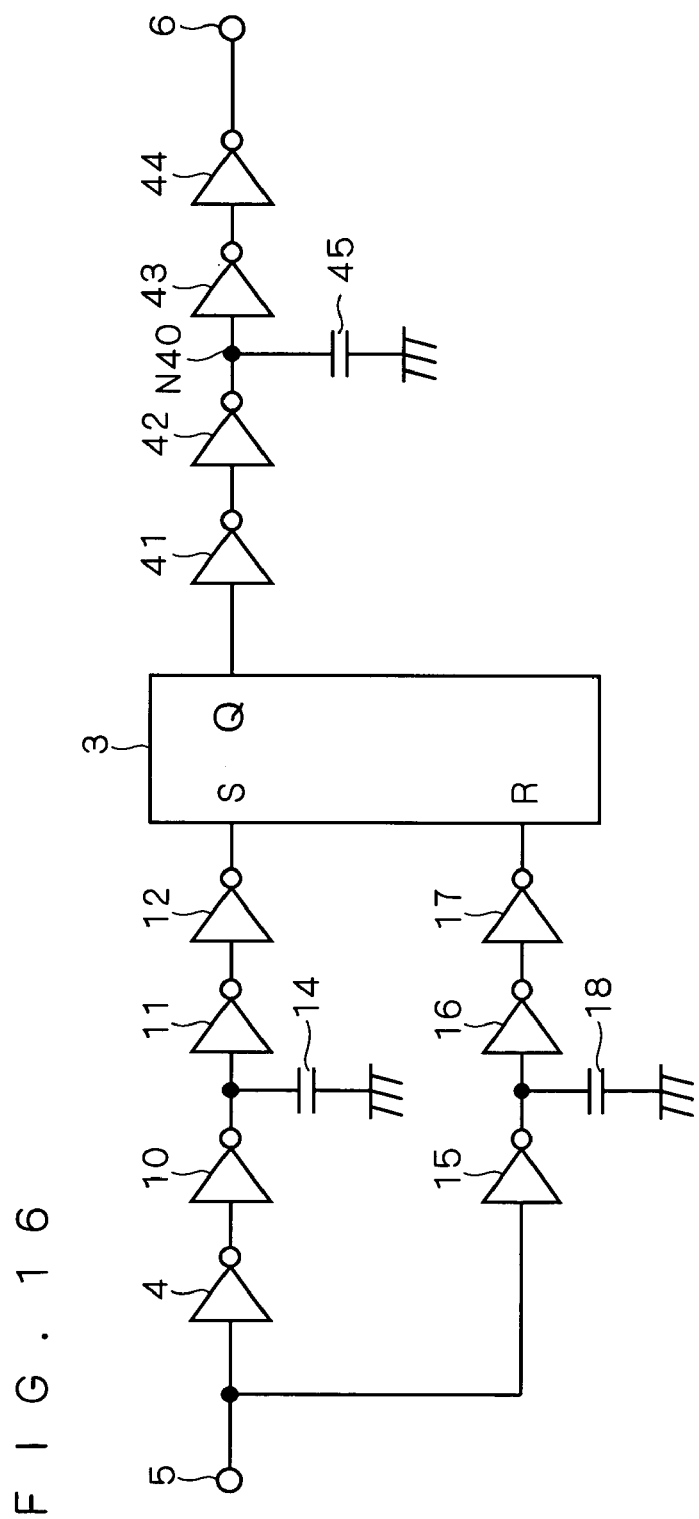
FIG. 16 is a circuit diagram used to describe a problem solved by the semiconductor circuit of the fifth preferred embodiment.

For example, as shown in FIG. 16, in another method to increase the delay time of the output signal relative to the input signal, a conventional semiconductor circuit is connected in series to the preceding semiconductor circuit of the first preferred embodiment.

As shown in FIG. 16, the conventional semiconductor circuit includes series-connected inverter circuits 41 to 44 and a capacitor 45 connected between ground and a given node N40 between inverter circuits.

Figure 17:
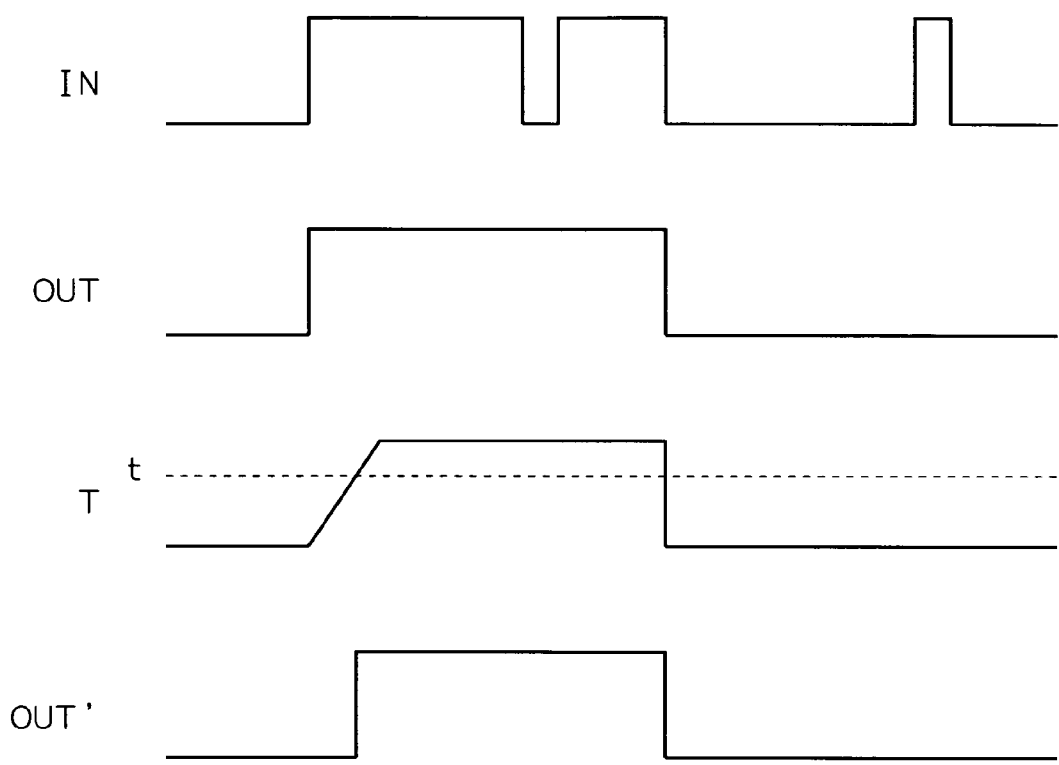
FIG. 17 is a timing chart used to describe the problem solved by the semiconductor circuit of the fifth preferred embodiment.

As shown in FIG. 17, the output terminal 6 of the semiconductor circuit of FIG. 16 provides an output signal having a pulse width smaller than that of the input signal.

In the timing chart of FIG. 17, the signal at the top is an input signal IN provided to the input terminal 5 of the semiconductor circuit of FIG. 16, where noise is superimposed on the input signal IN. The second signal is an output signal OUT from the Q output terminal of the flip-flop 3 of FIG. 16, from which noise has been filtered off.

The third signal is a signal T at the node N40. The signal at the bottom is an output signal OUT' provided from the output terminal 6 of the semiconductor circuit of FIG. 16.

The timing chart of FIG. 17 does not show time delay. The inverter circuit 43, immediately following the node N40, operates on the basis of a threshold potential "t".

As can be seen by comparing the input signal IN and the output signal OUT' of FIG. 17, the pulse width of the output signal OUT' is smaller than the pulse width of the input signal IN.

However, with the semiconductor circuit of this preferred embodiment shown in FIG. 15, the final stage can provide an output signal having the same pulse width as the input signal provided to the first stage when, in each semiconductor circuit stage, the charging rate of the first capacitor 14 is set the same as the charging rate of the second capacitor 18 and the discharging rate of the first capacitor 14 is set the same as the discharging rate of the second capacitor 18.

Thus, according to the semiconductor circuit of this preferred embodiment, it is possible to prevent reduction or elimination of the input signal pulse width even when plural stages of semiconductor circuits are connected in series to increase the delay time of the output signal with respect to the input signal.

Also, when the second and subsequent semiconductor circuit stages have delay times not more than the filter time of the first semiconductor circuit stage, it is possible to determine the filter time in the first semiconductor circuit stage and determine the delay time in other semiconductor circuit stages. That is to say, the filter time and the delay time can be set in separate semiconductor circuits.

Furthermore, when the semiconductor circuit having the largest delay time (filter time) is disposed in the first stage, it is possible to suppresses malfunction and to reduce power consumption. These effects are based on the factors below.

A variation of logic state in a semiconductor circuit may induce noise and consume power. If a semiconductor circuit having the maximum delay time is disposed not in the first stage but in a second or subsequent stage, then an input signal containing noise with a large pulse width passes through plural semiconductor circuit stages before reaching the semiconductor circuit having the maximum delay time. Then, the passage of the noise-containing input signal through plural semiconductor circuit stages is more likely to induce further noise and consume power unnecessarily.

However, when the semiconductor circuit with the maximum delay time is disposed in the first stage as described above, all noise having removable pulse widths superimposed on the input signal can be effectively removed in the first semiconductor circuit stage. This prevents unnecessary noise transmission to the second and subsequent semiconductor circuit stages.

Thus, since no unnecessary logic state variation occurs in the second and subsequent semiconductor circuit stages, it is possible to prevent unnecessary operations of the following semiconductor circuits, so as to suppress malfunction and to reduce power consumption in the following semiconductor circuits.

While the description above has shown an example in which plural stages of the semiconductor circuits of the first preferred embodiment are connected in series, this example is meant to be illustrative. That is, any of the semiconductor circuits of the first to fourth preferred embodiments can be adopted as the plural stages of semiconductor circuits.

Figure 18:
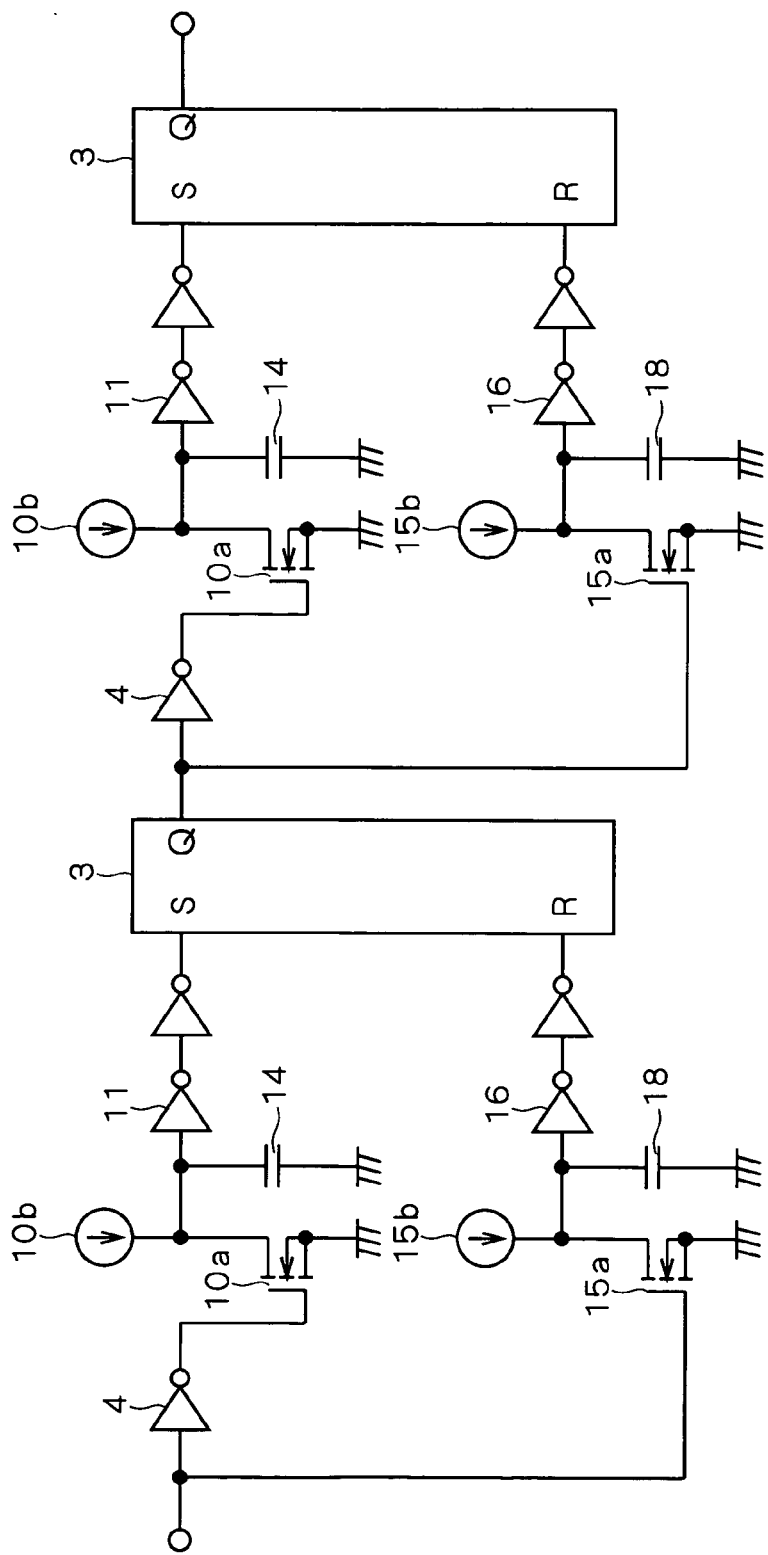
FIG. 18 is a circuit diagram showing another example of series connection of semiconductor circuits according to the fifth preferred embodiment.

For example, as shown in FIG. 18, a plurality of semiconductor circuits of the second preferred embodiment may be connected in series, or semiconductor circuits of the first to fourth preferred embodiments may be adopted in combination to form series-connected semiconductor circuit stages.

In this case, it is possible to configure all constant-current circuits so that they are connected with the same reference circuit. That is to say, a single reference circuit (not shown) generates a reference current and dependent current paths are current-mirror-connected with this reference current path and used as the constant-current circuits.

This configuration reduces variations among the constant-current circuits during manufacture.

That is to say, when individual constant-current circuits are made of separate circuits, variations occur among the constant-current circuits during manufacture, causing variations among characteristics of the constant-current circuits. Such a variation appears as a difference between the designed delay time (filter time) and the delay time (filter time) of the actually manufactured product, which leads to malfunction of the semiconductor circuitry. That is, an actually produced semiconductor circuit providing the main filter function and an actually produced semiconductor circuit providing the main delay function differ from the designed ones.

However, when a plurality of constant-current circuits are configured to be connected with the same reference circuit, variation during manufacture occurs in common among the plural semiconductor circuit stages, so that the relation among delay times of individual stages (or the relation among filter times of individual stages) of the manufactured product is unchanged from the designed relation.

Accordingly, for example, when the first and other semiconductor circuit stages are designed so that the delay times of the second and subsequent stages are not more than the filter time of the first stage in order to set the delay time and the filter time in separate semiconductor circuits, the relation among the delay times of the individual stages (or the relation among filter times of the individual stages) in the manufactured product remains unchanged from the designed one. This suppresses malfunction of the semiconductor circuits.

While FIG. 18 shows the constant-current circuits 10b and 15b that cause constant current to flow, the same effect can be obtained with a plurality of constant-current circuits that draw in constant current (the constant-current circuits 10q, 15q of FIG. 6), by configuring these constant-current circuits (the constant-current circuits 10q, 15q of FIG. 6) so that they operate on the basis of the same reference circuit (i.e. current-mirror structure).

<Sixth Preferred Embodiment>

Circuitry including a circuit portion that converts an analog signal to a digital signal, like the semiconductor circuit of FIG. 1, involves the problem below.

Figure 19:
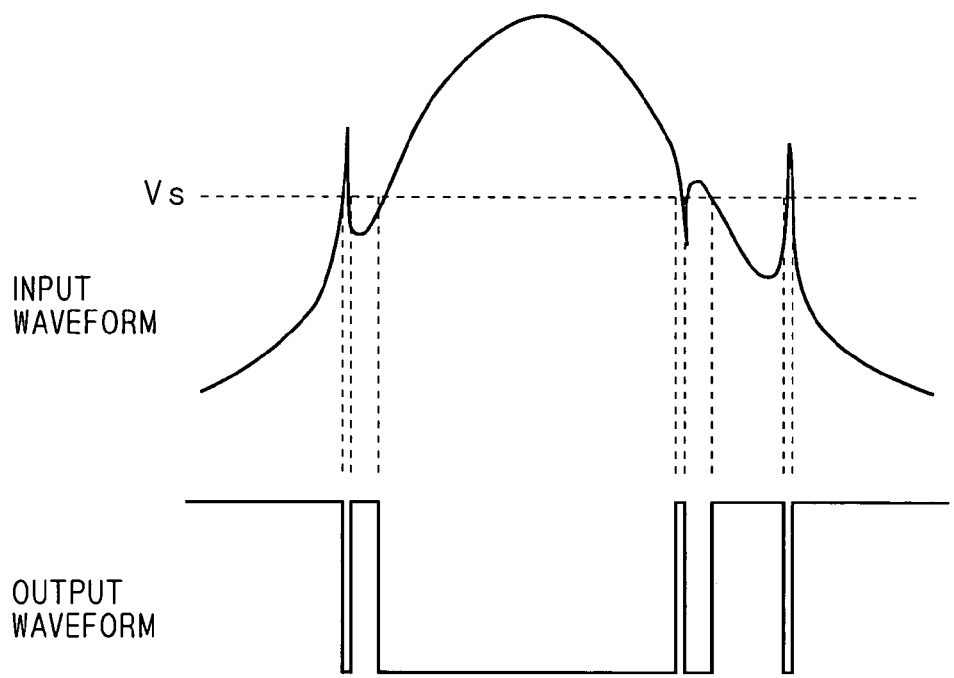
FIG. 19 is a diagram used to describe how an analog signal containing noise superimposed around a threshold potential is converted to a digital signal on the basis of that threshold potential.

For example, suppose that an analog signal shown in FIG. 19 is inputted to an inverter circuit having a threshold potential Vs. The analog signal contains noise finely varying around the threshold potential Vs.

In this case, the inverter circuit outputs a digital signal as shown in FIG. 19. That is, the output digital signal includes pulses reflecting the noise (i.e. chattering occurs).

Figure 20:
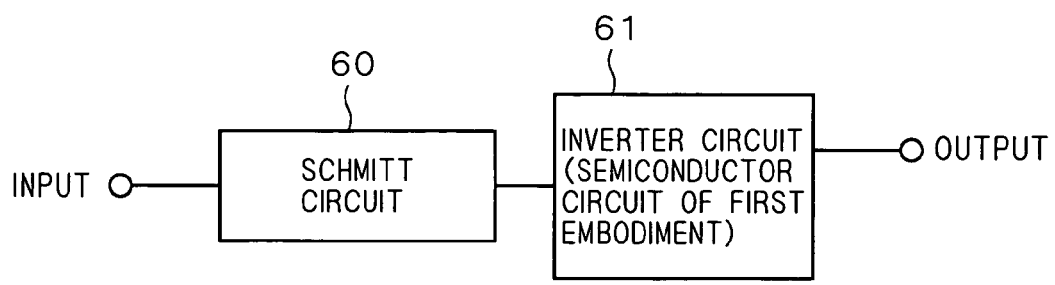
FIG. 20 is a diagram showing a configuration in which a Schmitt circuit is separately provided preceding a semiconductor circuit.

In order to suppress the chattering, as shown in FIG. 20, an inverter circuit 61 (which is the semiconductor circuit of FIG. 1 in the case of the first preferred embodiment: hereinafter referred to as a semiconductor circuit 61) may be preceded by a Schmitt circuit (hysteresis circuit) 60. The Schmitt circuit 60 has two threshold potentials. The difference between the two threshold potentials forms a hysteresis width.

However, this configuration has the problems below.

Figure 23:
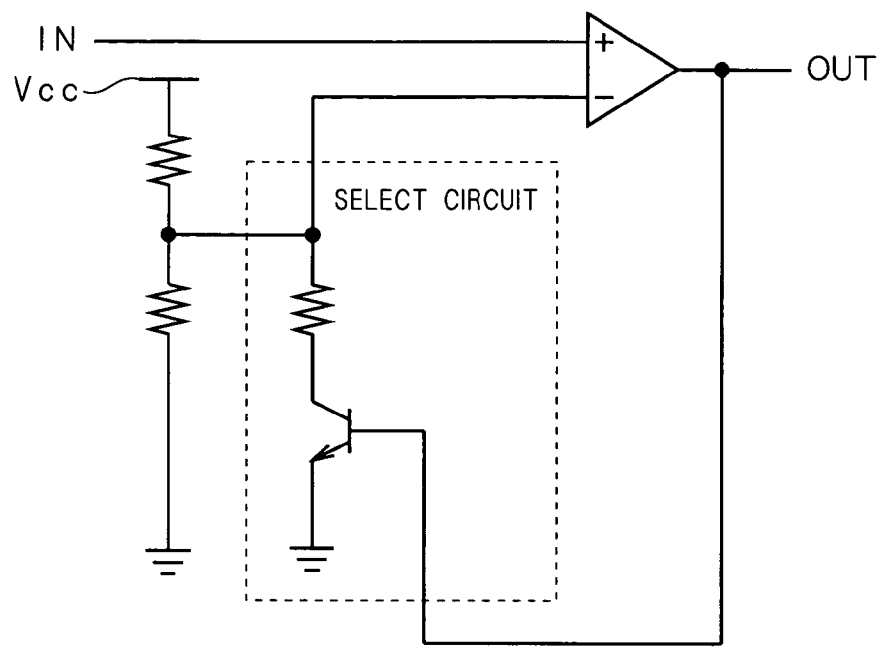

FIGS. 21 to 23 are specific circuit diagrams of existing Schmitt circuits 60. The Schmitt circuit 60 shown in FIG. 21 includes three PMOSs and three NMOSs. The Schmitt circuits 60 shown in FIGS. 22 and 23 each include a select circuit, a comparator, resistors, etc.

As can be seen from FIGS. 21 to 23, these configurations all need a large number of elements. This is because two threshold potentials are set in one Schmitt circuit 60.

Accordingly, providing a Schmitt circuit 60 separately from the semiconductor circuit 61 has a problem that the Schmitt circuit 60 occupies a large area. Also, the Schmitt circuit 60 consumes large power.

In the case of the Schmitt circuit 60 of FIG. 21, two threshold potentials are set in the Schmitt circuit 60 by adjusting the current driving capability balance among the MOS transistors. However, it is very difficult to adjust the balance with such a large number of MOS transistors. Therefore designing the Schmitt circuit 60 is very difficult.

Also, a variation of the gate voltage of an MOS transistor varies the temperature characteristic of the current driving capability. This makes designing the Schmitt circuit 60 more difficult since it requires considering the temperature characteristic of current driving capability.

Furthermore, it is well known that a Schmitt circuit 60, having two threshold potentials, has a slow response rate to the input signal. That is to say, such a Schmitt circuit 60 needs a long response time both at a rise and a fall of the input signal.

Therefore, the Schmitt circuit 60 cannot follow an input of high-frequency noise (noise having a shorter duration than the filter time of the semiconductor circuit (filter circuit) 61 succeeding the Schmitt circuit 60). Then the Schmitt circuit 60 outputs a signal fixed at H.

Then the H-fixed signal, longer than the filter time, is inputted to the semiconductor circuit (filter circuit) 61. In the configuration of FIG. 20, this means that the semiconductor circuit (filter circuit) 61 cannot effectively filter off the high-frequency noise.

Accordingly, in the semiconductor circuit of this preferred embodiment, the signal inverting means (also regarded as an inverter circuit) 4 and the second inverter circuit 15 in the semiconductor circuit (FIG. 1) of the first preferred embodiment are designed as follows.

That is to say, the signal inverting means 4 is designed to have a first threshold potential. The second inverter circuit 15 is designed to have a second threshold potential. The difference between the first threshold potential and the second threshold potential forms a hysteresis width.

Figure 24:
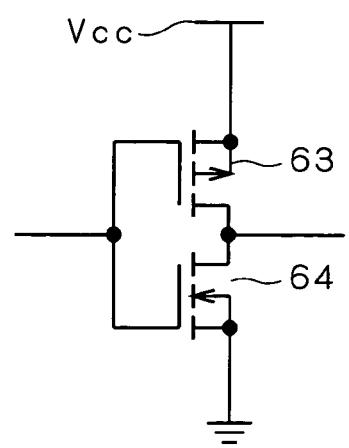
FIGS. 24 and 25 are circuit diagrams showing specific configurations of inverter circuits capable of setting a single threshold potential.
Figure 25:
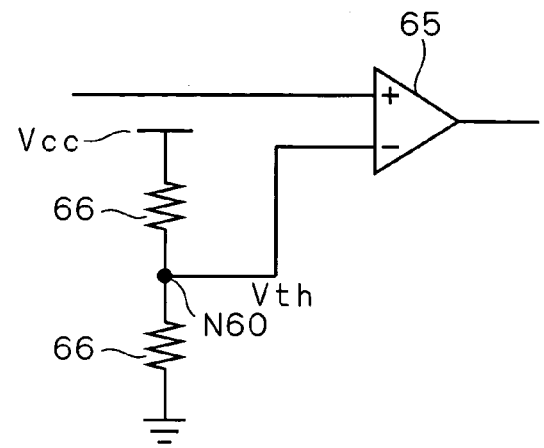

FIGS. 24 and 25 show specific circuit configurations of the signal inverting means 4 and the second inverter circuit 15 of this preferred embodiment.

As shown in FIG. 24, the signal inverting means 4 and the second inverter circuit 15 are formed of one PMOS 63 and one NMOS 64. The PMOS 63 and the NMOS 64 are connected in series between a fixed potential Vcc and ground.

The source of the PMOS 63 is connected to the fixed potential Vcc. The drain of the PMOS 63 is connected to the drain of the NMOS 64. The source of the NMOS 64 is connected to ground. The gate of the PMOS 63 and the gate of the NMOS 64 are connected to the input terminal.

A node between the PMOS 63 and the NMOS 64 outputs a signal to the following circuit stage.

It is possible to provide the signal inverting means 4 with the first threshold potential and the second inverter circuit 15 with the second threshold potential by properly designing the gate width and gate length of the PMOS 63, the gate width and gate length of the NMOS 64, and the like.

Also, as shown in FIG. 25, the signal inverting means 4 and the second inverter circuit 15 may be formed of one comparator 65 and resistors 66. The resistors 66 are connected between a fixed potential Vcc and ground.

The plus input of the comparator 65 receives an input signal from the previous stage. The minus input of the comparator 65 is connected to a node N60 between the resistors 66. The output of the comparator 65 provides an output signal to the following circuit stage.

It is possible to provide the signal inverting means 4 with the first threshold potential and the second inverter circuit 15 with the second threshold potential by properly adjusting the position of the node N60 with respect to the resistors 66.

Figure 26:
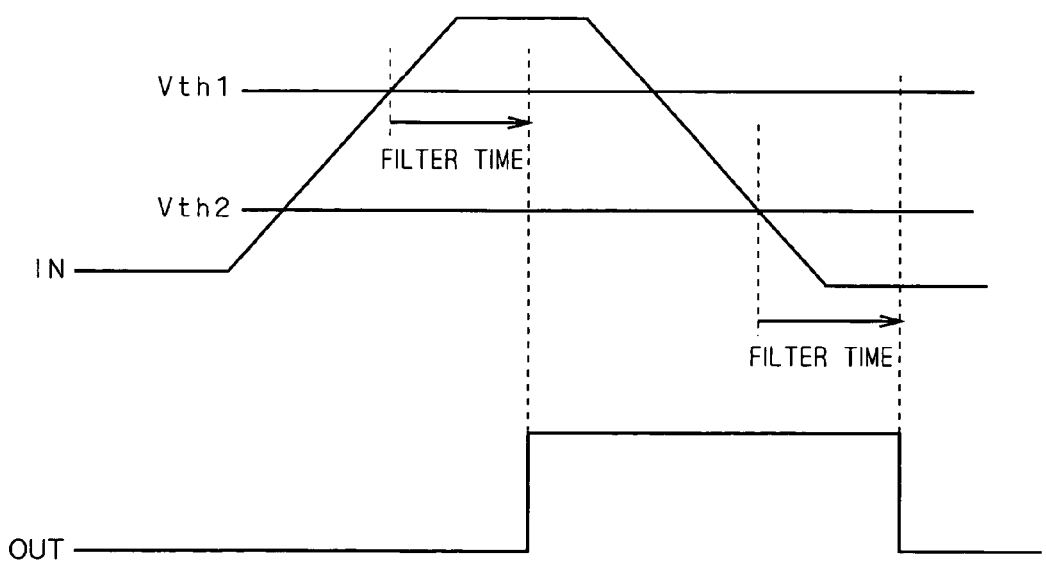
FIG. 26 is a diagram showing the relation between an input signal to and an output signal from a semiconductor circuit according to a sixth preferred embodiment.

FIG. 26 shows waveform variations in the semiconductor circuit of this preferred embodiment. In the semiconductor circuit of FIG. 1, the signal inverting means (which can be regarded as an inverter circuit) 4 has a first threshold potential Vth1 and the second inverter circuit 15 has a second threshold potential Vth2.

The IN waveform at the top of FIG. 26 is inputted to the semiconductor circuit. Then the semiconductor circuit outputs the OUT waveform shown at the bottom of FIG. 26.

When the IN waveform rises to reach the first threshold potential Vth1 and then a given filter time set in the semiconductor circuit has passed, the OUT waveform rises. When the potential of the IN waveform starts falling to reach the second threshold potential Vth2 and then a given filter time set in the semiconductor circuit has passed, the OUT waveform falls.

In this way, in the semiconductor circuit of this preferred embodiment, the signal inverting means (regarded also as an inverter) 4 has the first threshold potential, the second inverter circuit 15 has the second threshold, and the first and second threshold potentials form the hysteresis width.

Thus just a single threshold potential (Vth1 or Vth2) is set in each of the signal inverting means 4 and the second inverter circuit 15.

This reduces the circuit area as can be clearly seen from FIGS. 24 and 25. Reducing the entire circuit area reduces power consumption. Furthermore, setting a single threshold potential is easy.

For example, with the configuration of FIG. 24, a single threshold potential can be set simply by adjusting the current driving capability balance between the two MOS transistors 63 and 64. With the configuration of FIG. 25, a single threshold potential can be set simply by adjusting the position of the node N60 between the resistors 66 that is connected to the minus input of the comparator 65.

In FIG. 24, the mobility of the PMOS 63 is denoted as βp, the gate voltage as Vthp, the gate width as Wp, and the gate length as Lp. Also, the mobility of the NMOS 64 is denoted as βn, the gate voltage as Vthn, the gate width as Wn, and the gate length as Ln.

Then, one threshold voltage Vth can be set according to βp·(Wp/Lp)·(V0−Vth−Vthp)$^2$=βn·(Wn/Ln)·(Vth−Vthn)$^2$. Where V0 is the voltage value of the fixed potential Vcc.

Now, it is assumed that one Schmitt circuit 60 is constructed as shown in FIG. 21 using MOS transistors (when the gate voltage of an MOS transistor varies, then the temperature characteristic of the current driving capability varies). In this case, it is a known fact that the temperature characteristic variation of the first threshold potential Vth1 and the temperature characteristic variation of the second threshold potential Vth2 differ from each other. This is because the first and second threshold potentials are determined on the basis of two different input potentials (the input signal from the stage preceding the Schmitt circuit 60 and the fixed potential in the Schmitt circuit 60).

Therefore the hysteresis width Δ VTH (=Vth1−Vth2), defined by the difference between the first threshold potential Vth1 and the second threshold potential Vth2, has a temperature dependence.

This problem can be solved by adopting the semiconductor circuit of this preferred embodiment. This is because a single input signal is inputted in common to the signal inverting means 4 and the second inverter 15 and the first threshold potential Vth1 and the second threshold potential Vth2 are determined on the basis of this single input signal.

Suppose the signal inverting means 4 and the second inverter 15 are formed of MOS transistors as shown in FIG. 24, for example (the temperature characteristic of the current driving capability of an MOS transistor varies as its gate voltage varies). However, since the same input signal is inputted to the signal inverting means 4 and the second inverter 15, the temperature characteristic variation of the first threshold potential Vth1 and the temperature characteristic variation of the second threshold potential Vth2 are the same.

Therefore, in the semiconductor circuit of this preferred embodiment, the hysteresis width Δ VTH (=Vth1−Vth2), defined by the difference between the first threshold potential Vth1 and the second threshold potential Vth2, has no temperature dependence.

Also, in the semiconductor circuit of this preferred embodiment, just a single threshold potential is set in each of the signal inverting means 4 and the second inverter 15. When high-frequency noise (with a duration shorter than the filter time of the semiconductor circuit) is inputted to the signal inverting means 4 and the second inverter 15, they quickly respond to one of the rise and fall of that noise.

It is therefore possible to transmit the high-frequency noise intactly to the circuitry following the signal inverting means 4 and the second inverter 15. Thus, even with high-frequency noise having a shorter duration than the filter time, the semiconductor circuit of this preferred embodiment can effectively filter off the high-frequency noise.

The description above has shown an application of the configuration of this preferred embodiment to the semiconductor circuit of the first preferred embodiment. However, this preferred embodiment can be applied also to the examples below.

In the description above, the first threshold potential Vth1 is set in the signal inverting means 4 and the second threshold potential Vth2 is set in the second inverter circuit 15.

However, a new, third inverter circuit may be provided preceding the first delay circuit 1 and a new, fourth inverter circuit may be provided preceding the second delay circuit 2.

Figure 27:
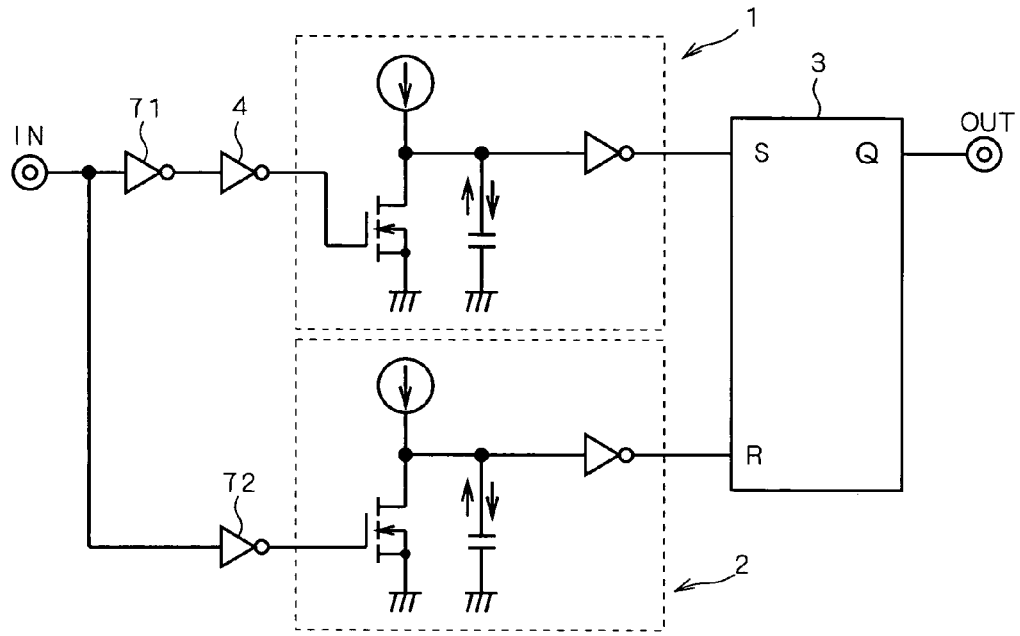
FIGS. 27 to 29 are circuit diagrams showing other examples of the semiconductor circuit of the sixth preferred embodiment.
Figure 28:
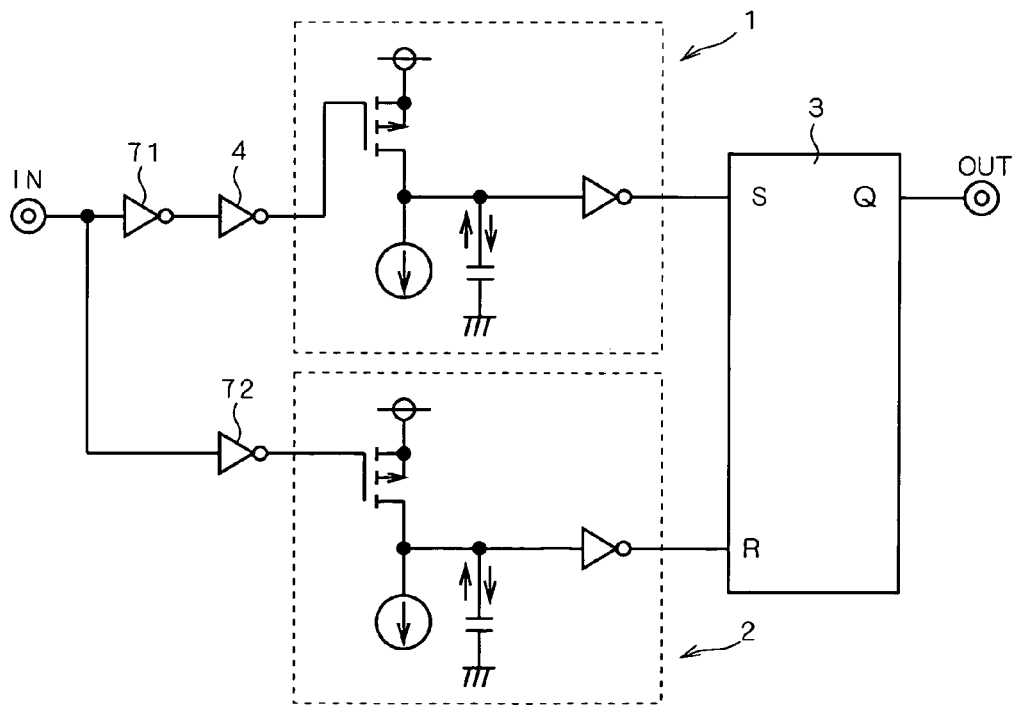
Figure 29:
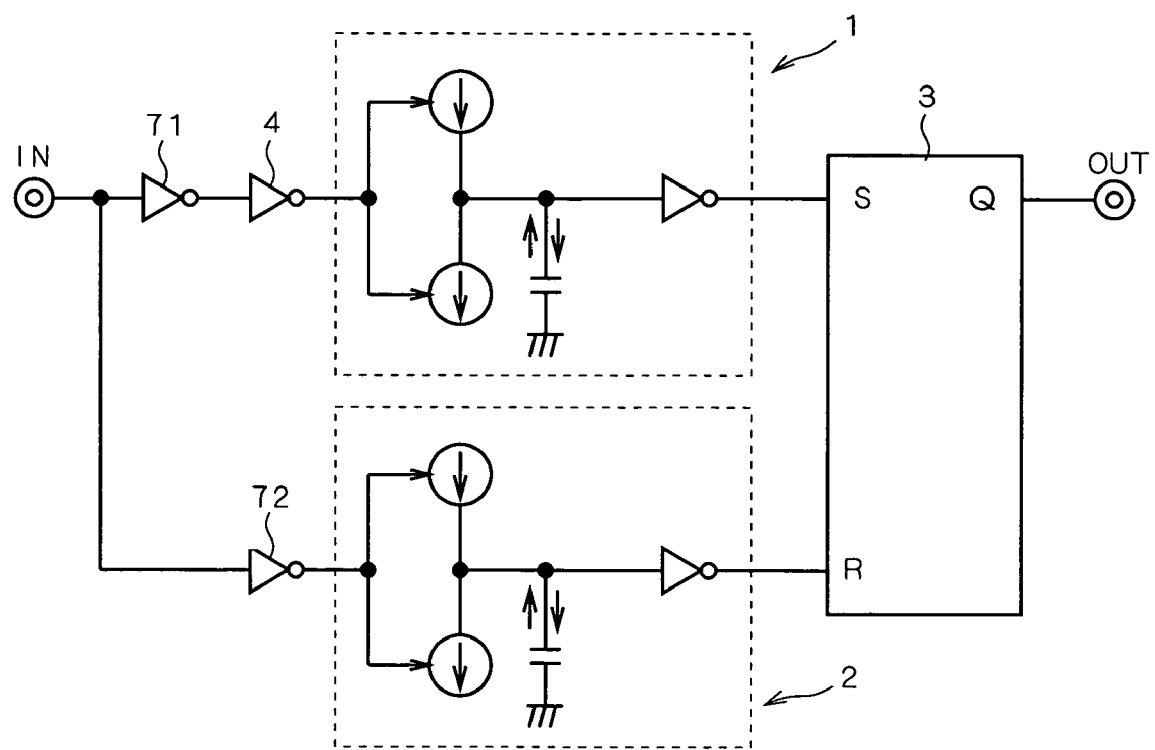

Where, a first threshold potential is set in the third inverter circuit and a second threshold potential is set in the fourth inverter circuit. The difference between the first and second threshold potentials forms the hysteresis width. FIGS. 27 to 29 show examples of such structure.

FIGS. 27, 28 and 29 show examples in which the configuration of this preferred embodiment is applied to the semiconductor circuits of the second, third, and fourth preferred embodiments, respectively.

In FIGS. 27, 28 and 29, a third inverter circuit 71 precedes the first delay circuit 1. Also, a fourth inverter circuit 72 precedes the second delay circuit 2. The first threshold potential Vth1 is set in the third inverter circuit 71 and the second threshold potential Vth2 is set in the fourth inverter circuit 72.

As for specific circuit configurations of the third inverter circuit 71 and the fourth inverter circuit 72, those described referring to FIGS. 24 and 25 are applied.

While the invention has been described in detail, the foregoing description is in all aspects illustrative and not restrictive. It is understood that numerous other modifications and variations can be devised without departing from the scope of the invention.

What is claimed is:

1. A semiconductor circuit comprising:
a first delay circuit including a first integrating circuit;
a second delay circuit including a second integrating circuit;
a circuit portion that inputs an in-phase version and an inverted-phase version of an input signal individually to one and the other of said first and second delay circuits; and
a flip-flop that receives an output signal from said first delay circuit and an output signal from said second delay circuit respectively at its first and second input terminals,
wherein a plurality of said semiconductor circuits are connected in series, and
a leading one of said plurality of series-connected semiconductor circuits has a longest delay time.

2. A semiconductor circuit comprising:
a first delay circuit including a first integrating circuit;
a second delay circuit including a second integrating circuit;

a circuit portion that inputs an in-phase version and an inverted-phase version of an input signal individually to one and the other of said first and second delay circuits; and a flip-flop that receives an output signal from said first delay circuit and an output signal from said second delay circuit respectively at its first and second input terminals, wherein:

said first integrating circuit includes a first capacitor and said second integrating circuit includes a second capacitor, said first delay circuit comprises:

a plurality of first inverter circuits connected in series; and said first capacitor connected between a first node between given ones of said first inverter circuits and a first fixed potential, and said second delay circuit comprises:

a plurality of second inverter circuits connected in series; and said second capacitor connected between a second node between given ones of said second inverter circuits and a second fixed potential, and wherein said circuit portion that inputs the in-phase version and the inverted-phase version of said input signal individually to one and the other of said first and second delay circuits comprises a third inverter circuit that precedes said first delay circuit, and said third inverter circuit has a first threshold potential, one of said second inverter circuits that precedes said second node has a second threshold potential, and a difference between said first threshold potential and said second threshold potential forms a hysteresis width.

3. A semiconductor circuit comprising:

a first delay circuit including a first integrating circuit;

a second delay circuit including a second integrating circuit;

a circuit portion that inputs an in-phase version and an inverted-phase version of an input signal individually to one and the other of said first and second delay circuits; and a flip-flop that receives an output signal from said first delay circuit and an output signal from said second delay circuit respectively at its first and second input terminals, wherein:

said first integrating circuit includes a first capacitor and said second integrating circuit includes a second capacitor, said first delay circuit comprises:

a plurality of first inverter circuits connected in series; and said first capacitor connected between a first node between given ones of said first inverter circuits and a first fixed potential, and said second delay circuit comprises:

a plurality of second inverter circuits connected in series; and said second capacitor connected between a second node between given ones of said second inverter circuits and a second fixed potential, the semiconductor circuit further comprising a third inverter circuit preceding said first delay circuit and a fourth inverter circuit preceding said second delay circuit, wherein said third inverter circuit has a first threshold potential and said fourth inverter circuit has a second threshold potential, and a difference between said first threshold potential and said second threshold potential forms a hysteresis width.

* * * * *